ized in International

(12) United States Patent
Ueda et al.

(10) Patent No.: US 12,140,430 B2
(45) Date of Patent: Nov. 12, 2024

(54) SENSOR DEVICE AND SENSOR

(71) Applicant: Panasonic Intellectual Property Management Co., Ltd., Osaka (JP)

(72) Inventors: Hideki Ueda, Fukui (JP); Yusuke Nakamura, Hyogo (JP); Koichiro Nakashima, Fukui (JP); Takashi Uchida, Osaka (JP); Toshio Yamazaki, Fukui (JP); Hiroyuki Fujii, Fukui (JP); Chikara Nara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 225 days.

(21) Appl. No.: 17/774,381

(22) PCT Filed: Nov. 6, 2020

(86) PCT No.: PCT/JP2020/041549
§ 371 (c)(1),
(2) Date: May 4, 2022

(87) PCT Pub. No.: WO2021/095658
PCT Pub. Date: May 20, 2021

(65) Prior Publication Data
US 2022/0364864 A1 Nov. 17, 2022

(30) Foreign Application Priority Data
Nov. 11, 2019 (JP) .................................. 2019-204209

(51) Int. Cl.
*G01C 19/5783* (2012.01)
*B81B 7/00* (2006.01)

(52) U.S. Cl.
CPC ........ *G01C 19/5783* (2013.01); *B81B 7/0048* (2013.01); *B81B 7/0074* (2013.01); *B81B 2201/0242* (2013.01); *B81B 2207/012* (2013.01)

(58) Field of Classification Search
None
See application file for complete search history.

(56) References Cited

U.S. PATENT DOCUMENTS 5,535,626 A * 7/1996 Bullis ..................... G01P 1/023
73/514.32
7,002,257 B2 * 2/2006 Tao ......................... H01L 24/29
257/E31.127

(Continued)

FOREIGN PATENT DOCUMENTS

JP S62-035476 U 3/1987
JP H11-211750 A 8/1999

(Continued)

OTHER PUBLICATIONS

International Search Report dated Dec. 22, 2020 issued in International Patent Application No. PCT/JP2020/041549, with English translation.

*Primary Examiner* — Patrick Assouad
*Assistant Examiner* — Mark A Shabman
(74) *Attorney, Agent, or Firm* — Rimon P.C.

(57) ABSTRACT

A sensor device includes a sensor element, a supporting member, a substrate, and a bonding wire. The supporting member is electrically connected to the sensor element. The substrate is electrically connected to the supporting member. The bonding wire forms at least part of a connection path that electrically connects the sensor element and the supporting member together. The substrate and an installation member on which the sensor element is installed intersect (Continued)

with each other. The sensor element and the supporting member are separated from each other.

12 Claims, 14 Drawing Sheets

(56) References Cited

U.S. PATENT DOCUMENTS

| | | | | |
|---|---|---|---|---|
| 2001/0055836 | A1* | 12/2001 | Kunda | G01P 15/125 438/108 |
| 2002/0007678 | A1 | 1/2002 | Ueyanagi et al. | |
| 2003/0070483 | A1* | 4/2003 | Mueller | G01P 1/023 73/866.5 |
| 2004/0169244 | A1* | 9/2004 | MacGugan | G01C 21/166 257/416 |
| 2005/0199988 | A1* | 9/2005 | Ikezawa | C09J 7/10 257/678 |
| 2006/0097331 | A1* | 5/2006 | Hattori | G01C 19/5719 257/414 |
| 2009/0255335 | A1* | 10/2009 | Fly | G01C 19/5719 73/493 |
| 2010/0193972 | A1* | 8/2010 | Yamamoto | C01G 49/0072 257/789 |
| 2012/0236507 | A1* | 9/2012 | Koyama | G01C 19/5783 361/728 |
| 2013/0187188 | A1* | 7/2013 | Sasaoka | H05K 1/0313 174/255 |
| 2015/0008610 | A1* | 1/2015 | Bordin | B29D 35/148 264/161 |
| 2016/0365681 | A1* | 12/2016 | Mito | H01R 13/73 |

FOREIGN PATENT DOCUMENTS

| | | |
|---|---|---|
| JP | 2002-098709 A | 4/2002 |
| JP | 2009-122049 A | 6/2009 |
| JP | 2011-027708 A | 2/2011 |
| JP | 2016-170002 A | 9/2016 |

* cited by examiner

SENSOR DEVICE AND SENSOR

CROSS-REFERENCE OF RELATED APPLICATIONS

This application is the U.S. National Phase under 35 U.S.C. § 371 of International Patent Application No. PCT/JP2020/041549, filed on Nov. 6, 2020, which in turn claims the benefit of Japanese Patent Application No. 2019-204209, filed on Nov. 11, 2019, the entire disclosures of which Applications are incorporated by reference herein.

TECHNICAL FIELD

The present disclosure generally relates to a sensor device and a sensor, and more particularly relates to a sensor device and a sensor, each including a sensor element and a supporting member that supports the sensor element thereon.

BACKGROUND ART

Patent Literature 1 discloses a sensor device (gyro module) including a sensor element (gyrosensor), a substrate, and a supporting member (supporter) that bonds the sensor element and the substrate together with an adhesive. In this sensor device, a gap is left between the sensor element and the substrate around the supporting member.

In the sensor device of Patent Literature 1, a terminal (external terminal) provided on an outer bottom surface serving as a surface of the sensor element on the positive side of the Z-axis is connected via a bonding wire to a terminal (relay terminal) provided on an adhesive surface serving as a surface of the substrate on the positive side of the Z-axis.

In the sensor device with such a configuration, the bonding wire connects together the respective upper surfaces (i.e., the outer bottom surface and the adhesive surface), arranged to face the same direction (i.e., the +Z direction), of the substrate and the sensor element. Therefore, the bonding wire protrudes from the upper surface (outer bottom surface) of the sensor element, thus tending to increase the height dimension of the sensor device by the bonding wire.

CITATION LIST

Patent Literature

Patent Literature 1: JP 2016-170002 A

SUMMARY OF INVENTION

In view of the foregoing background, it is therefore an object of the present disclosure to provide a sensor device and a sensor, each contributing to increasing the degree of freedom in shape or dimensions.

A sensor device according to an aspect of the present disclosure includes a sensor element, a supporting member, a substrate, and a bonding wire. The supporting member is electrically connected to the sensor element. The substrate is electrically connected to the supporting member. The bonding wire forms at least part of a connection path that electrically connects the sensor element and the supporting member together. The substrate and an installation member on which the sensor element is installed intersect with each other. The sensor element and the supporting member are separated from each other.

A sensor according to another aspect of the present disclosure includes the sensor device described above and a mount board. The mount board is provided to install the sensor device thereon. The mount board has molding bur on a different surface other than a reference surface for positioning.

DESCRIPTION OF EMBODIMENTS

Note that the embodiments and their variations to be described below are only exemplary ones of various embodiments and variations of the present disclosure and should not be construed as limiting. Rather, the exemplary embodiments and their variations may be readily modified in various manners depending on a design choice or any other factor without departing from the true spirit and scope of the present disclosure.

(First embodiment)

A sensor device according to a first exemplary embodiment will now be described with reference to FIGS. 1A-5B.

(1) Overview

Figure 1A:
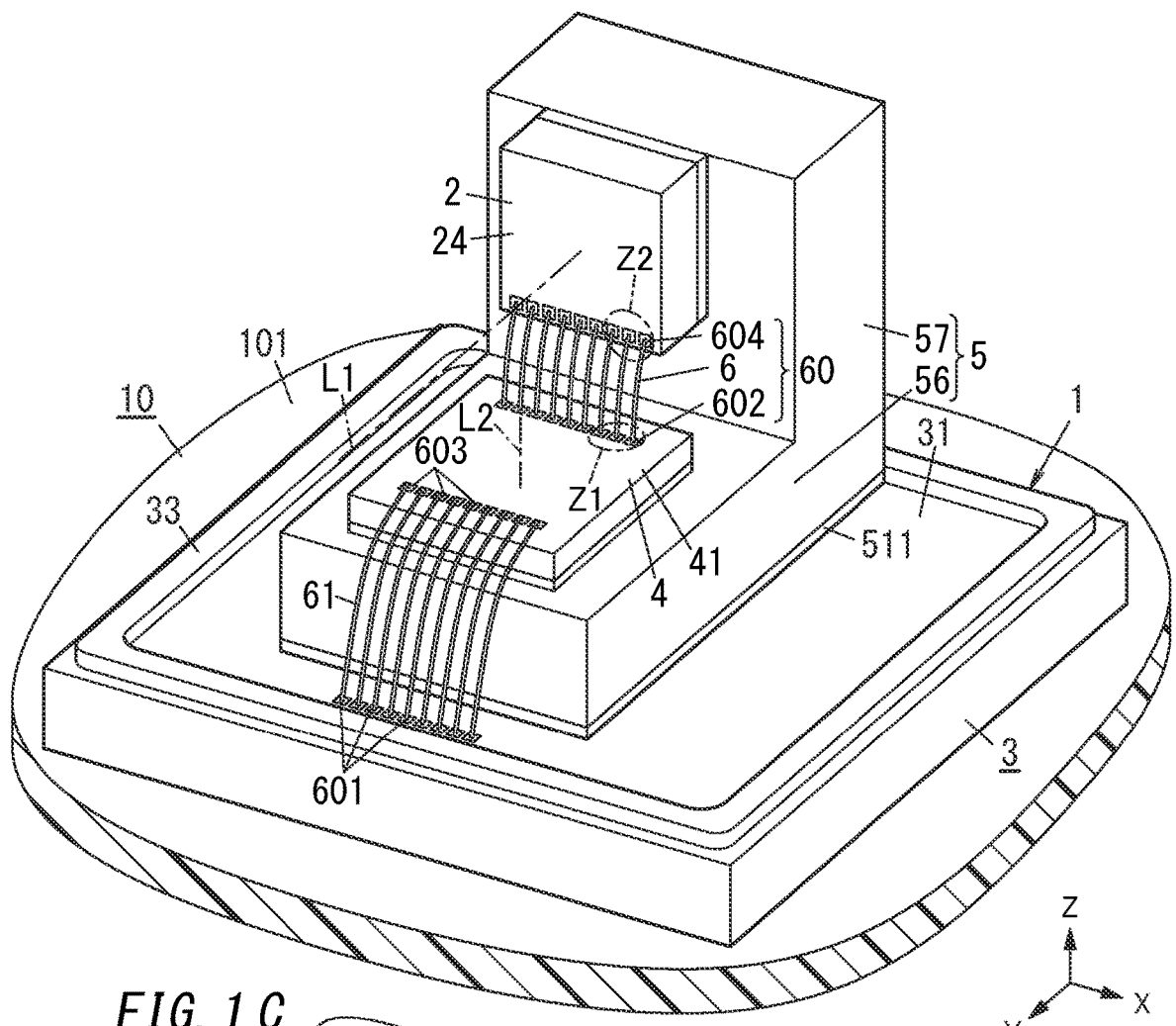
FIG. 1A is a perspective view illustrating a configuration for a sensor device according to a first embodiment, from which a case is removed.
Figure 1C:
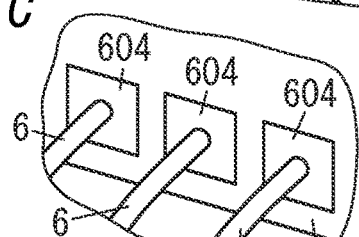
FIG. 1C is an enlarged view of a region Z2 shown in FIG. 1A.
Figure 1B:
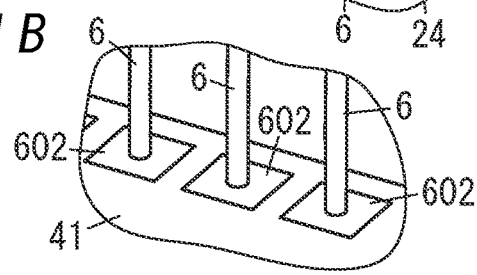
FIG. 1B is an enlarged view of a region Z1 shown in FIG. 1A.

A sensor device 1 according to this embodiment includes a sensor element 2, a substrate 3, a supporting member 4, and a coupling member 5 as shown in FIGS. 1A-1C. FIG. 1B is an enlarged view of a region Z1 shown in FIG. 1A. FIG. 1C is an enlarged view of a region Z2 shown in FIG. 1A.

In this sensor device 1, the sensor element 2 transforms a physical quantity such as angular velocity, acceleration, angular acceleration, velocity, pressure, weight, length (distance), or temperature into an electrical signal. That is to say, the sensor element 2 functions as a transducer for transforming a physical quantity into an electrical signal. The sensor device 1 of this type may be used in various types of devices including consumer electronic appliances, mobile telecommunications devices, cameras, wearable terminals, and game consoles, and moving vehicles such as vehicles (including automobiles and motorcycles), drones, aircrafts, and watercrafts.

The sensor device 1 according to this embodiment includes not only the sensor element 2, the substrate 3, the supporting member 4, and the coupling member 5 but also bonding wires 6 as well as shown in FIGS. 1A-1C. That is to say, the sensor device 1 includes the sensor element 2, the substrate 3, the supporting member 4, the coupling member 5, and the bonding wires 6. The bonding wires 6 form at least part of a connection path 60 that electrically connects the sensor element 2 and the supporting member 4 together. The bonding wires 6 are provided to connect two connection surfaces (namely, an electrode surface 24 and a supporting surface 41) that intersect with each other. The substrate 3 and the supporting member 4 are electrically connected to each other. The substrate 3 and an installation member 57 on which the sensor element 2 is installed intersect with each other. The sensor element and the supporting member 4 are separated from each other.

Alternatively, the installation member 57 on which the sensor element 2 is installed and the substrate 3 may intersect with each other at right angles.

According to this configuration, at least part of the connection path that electrically connects the sensor element 2 and the supporting member 4 together is implemented as the bonding wires 6 that connect the two connection surfaces (namely, the electrode surface 24 and the supporting surface 41) intersecting with each other. This may reduce, compared to connecting, via the bonding wires 6, two connection surfaces arranged to face the same direction, an increase in the height dimension, for example, of the sensor device 1 due to protrusion of the bonding wires 6 from the connection surface, for example. Consequently, the sensor device 1 according to this embodiment achieves the advantage of contributing to increasing the degree of freedom in shape or dimensions of the sensor device 1.

In addition, this sensor device 1 facilitates, compared to connecting, with a wiring member such as a lead frame or a flexible flat cable (FFC), two connection surfaces intersecting with each other, reducing the stress applied to the sensor element 2. That is to say, in the sensor device 1 according to this embodiment, the wiring member that connects the two connection surfaces intersecting with each other is the bonding wires 6, thus reducing the chances of the stress being transferred between the two connection surfaces via the wiring member (i.e., the bonding wires 6). This makes the stress much less easily transferrable from the substrate 3 and the supporting member 4, for example, to the sensor element 2, thus reducing the chances of the result of detection by the sensor element 2 being affected by the stress. Furthermore, in the sensor device 1 according to this embodiment, the two connection surfaces intersecting with each other are directly connected together via the bonding wires 6, thus eliminating the need to provide any wiring members other than the bonding wires 6 in order to connect the two connection surfaces together and thereby reducing the number of seams of the connection path 60.

(2) Configuration

Next, a specific configuration for the sensor device 1 according to this embodiment will be described in detail with reference to FIGS. 1A-5B.

In this embodiment, the sensor device 1 may be implemented as a gyro sensor designed to detect an "angular velocity" (i.e., an angular velocity sensor), for example. The sensor device 1 according to this embodiment is applicable particularly effectively to a situation where the angular velocity needs to be detected (measured) with relatively high accuracy (e.g., when applied to a technique for driving a vehicle autonomously). However, this is only an example of the present disclosure and should not be construed as limiting. Naturally, the sensor device 1 according to this embodiment is applicable to even a situation where the angular velocity does not have to be detected (measured) with high accuracy.

In the following description, X-, Y-, and Z-axes that intersect with each other at right angles are set as an example. In particular, an axis aligned with a normal L1 to the electrode surface of the sensor element 2 is supposed to be the Y-axis and an axis aligned with a normal to the installation surface 31 is supposed to be the Z-axis. The X-axis intersects at right angles with both of these Y- and Z-axes. Note that each of the X-, Y-, and Z-axes shown on the drawings is a virtual axis and the arrows designated by X, Y, and Z are shown there just for the sake of convenience of description and are insubstantial ones. It should also be noted that these directions do not define the directions in which the sensor device 1 should be used.

In this embodiment, the sensor device 1 is supposed to use the Y-axis as a detection axis and be designed to detect an angular velocity around the Y-axis as a target. The Y-axis is an axis aligned with a normal L1 to the electrode surface of the sensor element 2. Consequently, the sensor device 1 will detect, as a target, the angular velocity applied to the sensor device 1 itself as the sensor device 1 turns around the normal L1 to the electrode surface of the sensor element 2. That is to say, the sensor element 2 outputs an electrical signal representing the angular velocity around the sensor element 2 (i.e., around the Y-axis). This allows the magnitude of the angular velocity around the Y-axis to be measured based on the output of the sensor device 1.

As used herein, the "bonding wire" refers to a wiring member for electrically connecting two electrodes together and includes various types of wiring members with different materials and/or wire diameters. For example, bonding wires may be classifiable, according to their material, gold bonding wires, gold-alloy bonding wires, copper bonding wires, aluminum bonding wires, aluminum-silicon bonding wires, silver-alloy bonding wires, and other bonding wires.

As described above, the sensor device 1 according to this embodiment includes the sensor element 2, the substrate 3, and the bonding wire(s) 6. The sensor device 1 includes at least one bonding wire 6. In this embodiment, a plurality of (e.g., nine in the example illustrated in FIG. 1A) bonding wires 6 are provided. That is to say, the sensor device 1 according to this embodiment includes a plurality of bonding wires 6.

Figure 2:
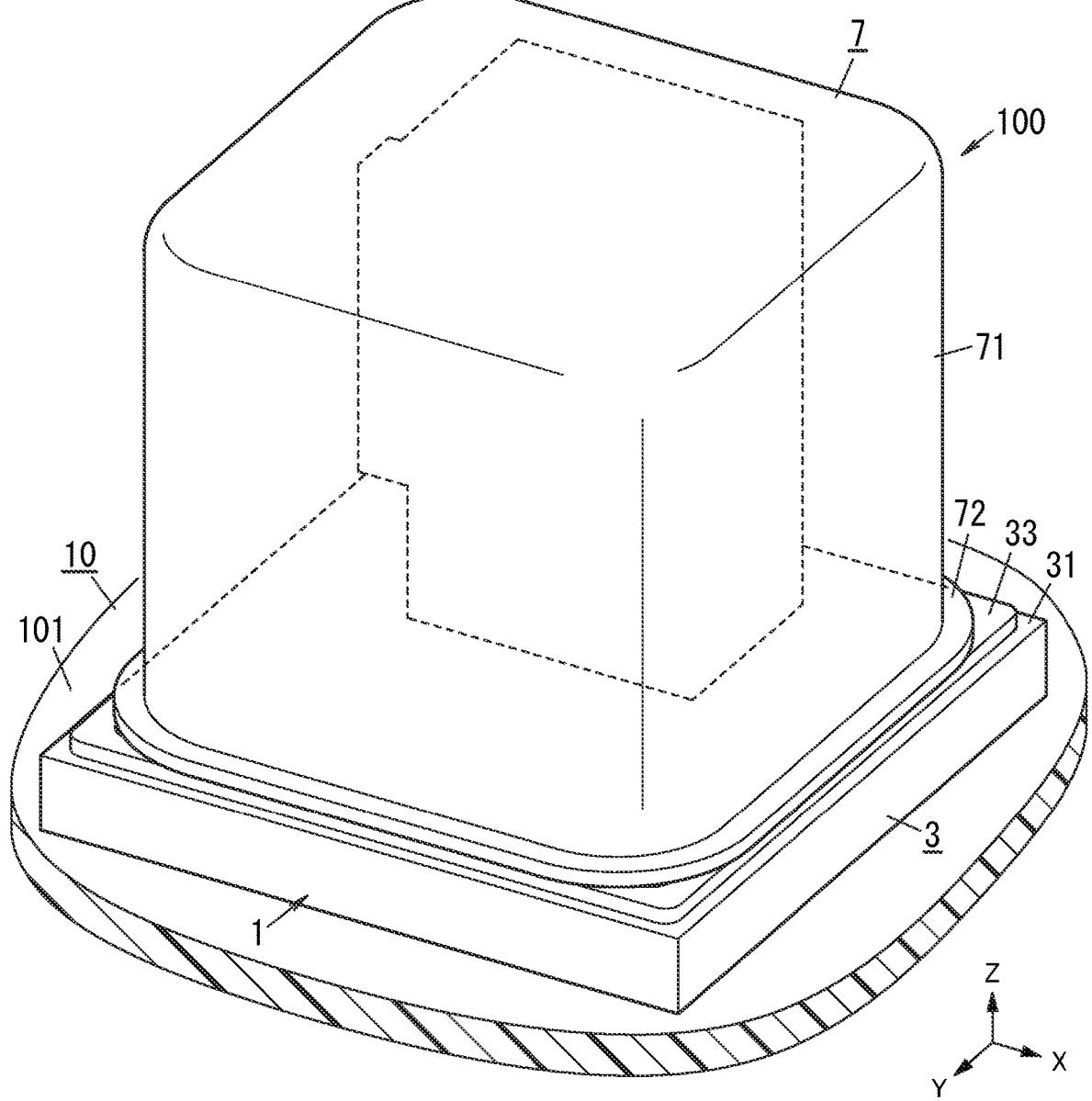
FIG. 2 is a perspective view illustrating a configuration for the sensor device.

Also, in this embodiment, the sensor device 1 includes not only the sensor element 2, the substrate 3, and the bonding wires 6 but also a supporting member 4, a coupling member 5, and a case 7 as well as shown in FIGS. 1A-4C. That is to say, the sensor device 1 includes the sensor element 2, the substrate 3, the supporting member 4, the coupling member 5, and the case 7. In every drawing but FIG. 2, illustration of the case 7 is omitted.

Furthermore, in this embodiment, the sensor device 1 is supposed to be flip-chip bonded, while being used, to a mount board 10 such as a printed wiring board with a surface, opposite from the installation surface 31, of the substrate 3 (i.e., a mounting surface 32 of the substrate 3) facing toward the mount board 10 as shown in FIGS. 1A-4C. In this embodiment, the mount board 10 to which the sensor device 1 is mounted is supposed to be a rigid board. However, this is only an example of the present disclosure and should not be construed as limiting. Alternatively, the mount board 10 may also be a flexible board, for example.

The sensor element 2 is an element that outputs an electrical signal representing a physical quantity to be detected. In this embodiment, the physical quantity to be detected is an angular velocity around the Y-axis (i.e., a normal L1 to the electrode surface of the sensor element 2) as described above. Thus, the sensor element 2 outputs an electrical signal representing an angular velocity around the Y-axis. The sensor element 2 may be implemented as, for example, a vibration-type gyro sensor and designed to detect an angular velocity around the Y-axis by using Coriolis force (deflecting force). That is to say, the sensor element 2 detects the angular velocity applied to the sensor element 2 itself by detecting the Coriolis force produced by external application of rotational force while vibrating a moving portion 21 thereof (see FIG. 5A).

In this embodiment, the sensor element 2 may include, for example, a bare chip to which micro electro mechanical systems (MEMS) technology is applied (i.e., a so-called "MEMS chip"). The sensor element 2 may further include, for example, a package such as a ceramic package, in which the bare chip is housed. This sensor element 2 includes the moving portion 21 in the bare chip and may detect the angular velocity by vibrating the moving portion 21.

Figure 3:
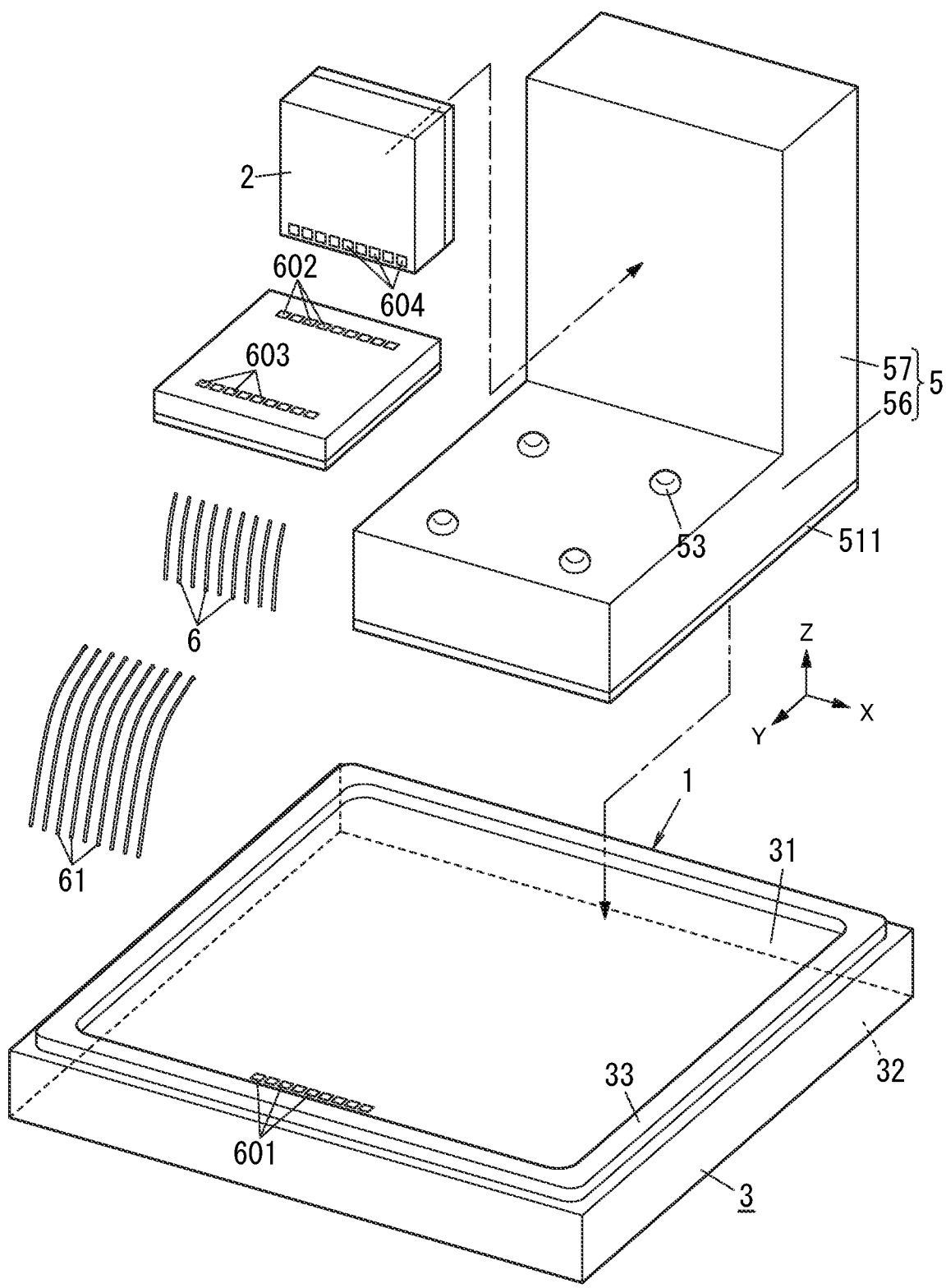
FIG. 3 is an exploded perspective view of the sensor device, from which the case is removed.

As shown in FIG. 3, the substrate 3 is formed in the shape of a flat plate and has thickness in the Z-axis direction. The substrate 3 has the installation surface 31 and the mounting surface 32 that face each other in the thickness direction. Specifically, over the installation surface 31, the supporting member 4 and the sensor element 2 are installed via the coupling member 5. On the other hand, the mounting surface 32 faces the mount board 10 in a state where the sensor device 1 is mounted onto the mount board 10.

In this embodiment, the substrate 3 may have a generally square shape in plan view, for example. The substrate 3 may be a ceramic substrate, for example, and has electrical insulation properties. The substrate 3 has a rib 33 protruding from the installation surface 31. The rib 33 is provided along outer peripheral edges of the installation surface 31 so as to surround a central area of the installation surface 31 along its circumference. Bonding a flange portion 72 (see FIG. 2) of the case 7 onto a tip surface of the rib 33 allows the case 7 to be bonded onto the substrate 3. Thus, a space for housing the sensor element 2 and other members is formed between the area, located inside the rib 33, of the installation surface 31 and the case 7.

The supporting member 4 is formed in the shape of a flat plate and has thickness in the Z-axis direction as shown in FIG. 3. The supporting member 4 has a supporting surface 41 and an attaching surface 42 that face each other in the thickness direction. That is to say, the supporting surface 41 is wire-bonded to the sensor element 2. On the other hand, the attaching surface 42 faces the coupling member 5.

In this embodiment, the supporting member 4 may have, for example, a generally square shape in plan view. In this case, the supporting member 4 is implemented as an application specific integrated circuit (ASIC). That is to say, the supporting member 4 has a configuration in which a semiconductor chip is built in a package with electrical insulation properties such as a resin package. Thus, in this embodiment, the sensor element 2 is connected, via the plurality of bonding wires 6, onto one surface (i.e., the supporting surface 41) of an ASIC package serving as the supporting member 4. In this embodiment, the semiconductor chip functions as a processor circuit 43 (see FIG. 4A) to be described later.

In this embodiment, the supporting member 4 includes supporting-end electrodes 602 (see FIG. 1B). The supporting-end electrodes 602 are electrodes, to which the bonding wires 6 are electrically connected, and are formed on the supporting surface 41. That is to say, the supporting member 4 has the supporting-end electrodes 602, to each of which one end of an associated one of the bonding wires 6 is connected. In this embodiment, the supporting-end electrodes 602 are provided on the supporting surface 41 of the supporting member 4. This allows the sensor element 2 installed on the coupling member 5 to be electrically connected to the processor circuit 43 of the supporting member 4. The processor circuit 43 of the supporting member 4 is further electrically connected to the (substrate-end electrodes 601 of the) substrate 3 via second bonding wires 61.

Figure 4A:
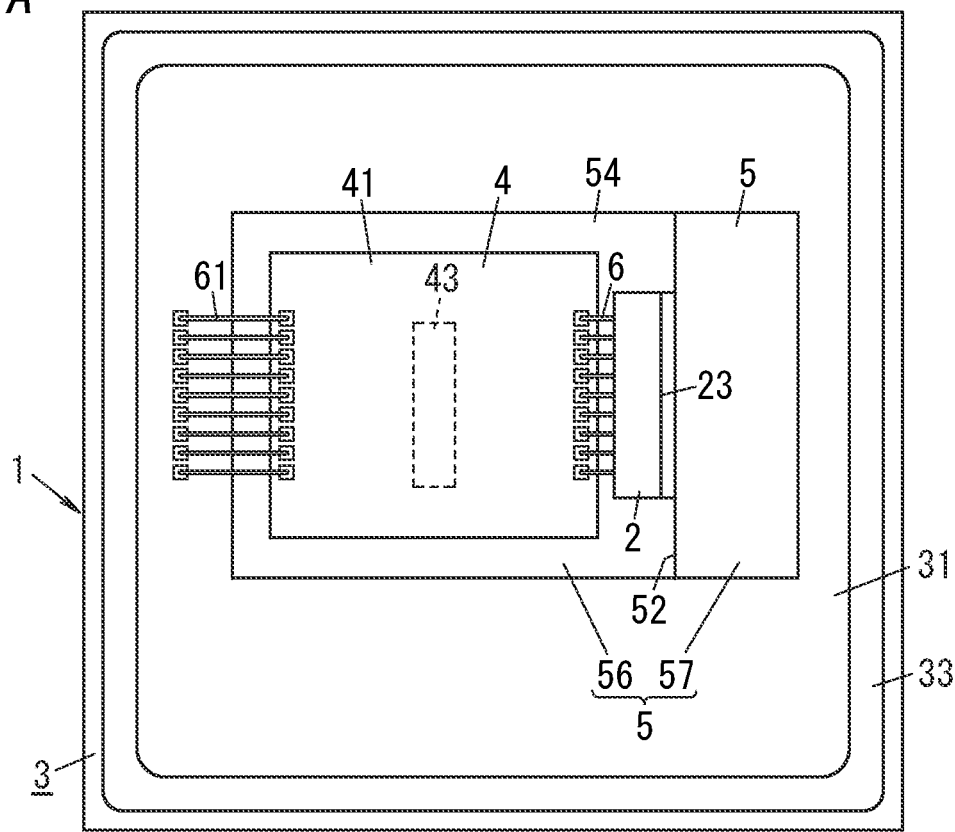
FIG. 4A is a plan view of the sensor device.
Figure 4C:
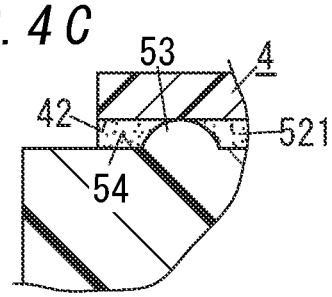
FIG. 4C is an enlarged view of a region Z1 shown in FIG. 4B.
Figure 4B:
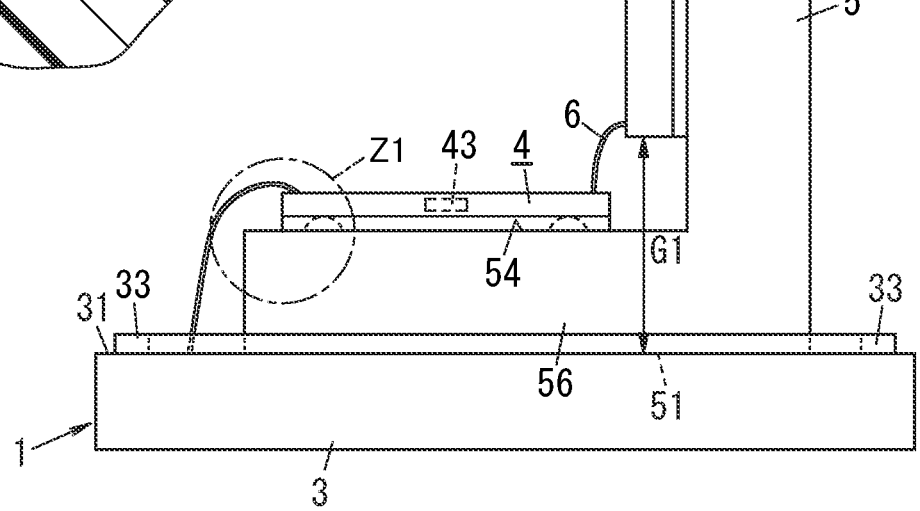
FIG. 4B is a side view of the sensor device.

The coupling member 5 is formed in an L-shape protruding in the Z-axis direction in side view as viewed in the X-axis direction as shown in FIG. 4B. In this embodiment, the Z-axis dimension (height) of the coupling member 5 is smaller than the Y-axis dimension (depth) of the coupling member 5. The coupling member 5 is made of a resin, for example, and has electrical insulation properties. In this embodiment, the coupling member 5 may be made of a liquid crystal polymer (LCP) resin, for example.

The coupling member 5 includes an installation member 57 and is installed on the installation surface 31 of the substrate 3 to couple the supporting member 4 to the substrate 3. In other words, the supporting member 4 is fixed to the installation surface 31 of the substrate 3 via the coupling member 5. As used herein, if something is "fixed," this phrase means that the thing is located at a constant position and immobilized by any of various means. In this embodiment, the relative position of the supporting member 4 with respect to the substrate 3 is defined by the coupling member 5. The coupling member 5 includes a first member 56 stacked on the substrate 3 and a second member 57 serving as an installation member 57. In the sensor device 1 according to this embodiment, the relative position of the supporting member 4 with respect to the substrate 3 is defined such that the supporting surface 41 of the supporting member 4 is aligned with the installation surface 31. As used herein, if something "is aligned with" something else, it means that these two things are generally parallel to each other, i.e., these two things may naturally be exactly parallel to each other but may also be arranged to form an angle of approximately several degrees (which may be less than 10 degrees, for example) between them. That is to say, the supporting surface 41 is generally parallel to the installation surface 31 of the substrate 3 (i.e., the supporting surface 41 may be exactly parallel to the installation surface 31 or may also form an angle of approximately several degrees with respect to the installation surface 31).

More specifically, the coupling member 5 has a first surface 51, a second surface 52, and a third surface 54 as shown in FIG. 4B. The first surface 51 is fixed to the installation surface 31 of the substrate 3. The second surface 52 intersects with the first surface 51. The sensor element 2 is fixed to the second surface 52. The third surface 54 is generally parallel to the first surface 51 and intersects with the second surface 52. The supporting member 4 is fixed onto the third surface 54. That is to say, the first surface 51 of the coupling member 5 is immobilized with respect to the installation surface 31 of the substrate 3. Likewise, the second surface 52 of the coupling member 5 is also immobilized with respect to an installation surface 23 of the sensor element 2.

The first surface 51 of the coupling member 5 is fixed onto the installation surface 31 of the substrate 3 by, for example, adhesion, pressure-sensitive adhesion, brazing, welding, or crimping. In this embodiment, the (first surface 51 of the) coupling member 5 is fixed to the substrate 3 by adhesion with an adhesive layer 511 (see FIG. 1). Likewise, the attaching surface 42 of the supporting member 4 is fixed onto the third surface 54 of the coupling member 5 by adhesion with an adhesive layer 521 (see FIG. 4C).

In this embodiment, the first surface 51 is one surface of the coupling member 5 in the Z-axis direction and the second surface 52 is one surface of the coupling member 5 in the Y-axis direction. The first surface 51 and the second surface 52 are generally perpendicular to each other. As used herein, if something is "generally perpendicular to" something else, the two things may naturally be exactly perpendicular to each other (i.e., intersect with each other at right angles (90 degrees)) but may also form an angle of at most 90±several degrees (e.g., 90±less than 10 degrees) between themselves. In this embodiment, the first surface 51 may be exactly perpendicular to the second surface 52, for example.

Thus, fixing the coupling member 5 with such a shape not only to the installation surface 31 of the substrate 3 on the first surface 51 but also to the attaching surface 42 of the supporting member 4 on the third surface 54 allows the supporting member 4 to be coupled to the substrate 3. In other words, the substrate 3 and the sensor element 2 are coupled to each other by fixing the coupling member 5 with the above-described shape to the installation surface 23 of the sensor element 2 on the second surface 52. In this case, the first surface 51 and the second surface 52 intersect with each other (at right angles in this embodiment), and therefore, the sensor element 2 is coupled to the substrate 3 via the coupling member 5 so that a normal L2 to the supporting surface 41 of the supporting member 4 is aligned with (e.g., parallel to in this embodiment) the installation surface 23.

In addition, the coupling member 5 further includes at least one spacer 53 (see FIG. 4C) protruding from a surface, facing the supporting member 4, (i.e., the third surface 54) of the coupling member 5 toward the supporting member 4. In this embodiment, the coupling member 5 includes a plurality of (e.g., four) spacers 53. Each of the spacers 53 may be formed in, for example, a dome shape (hemispherical shape). These (four) spacers 53 may be arranged at respective positions, facing the four corners of the attaching surface 42 of the supporting member 4, for example, on the third surface 54. Providing these spacers 53 allows a certain interval to be left between the third surface 54 of the coupling member 5 and the attaching surface 42 of the supporting member 4 as shown in FIG. 4C.

The height of each spacer 53, i.e., the protrusion height of the spacer 53 from the third surface 54, may fall within the range from 0.05 mm to 0.2 mm, for example. In this embodiment, each spacer 53 may have a height of 0.15 mm, for example. This allows an interval (gap) of 0.15 mm to be left between the third surface 54 of the coupling member 5 and the attaching surface 42 of the supporting member 4.

In this embodiment, as measured along the Z-axis (i.e., along the thickness of the substrate 3), the dimension of the coupling member 5 is larger than that of the supporting member 4 as shown in FIG. 4B. That is to say, the second surface 52 of the coupling member 5 has a larger Z-axis dimension than the installation surface 23 of the sensor element 2. In addition, the sensor element 2 is arranged to be aligned with the other end, opposite from one end closer to the substrate 3, of the second surface 52. This allows a gap G1 to be left between the installation surface 31 of the substrate 3 and the sensor element 2. That is to say, the sensor element 2 is fixed just indirectly to the substrate 3 via the coupling member 5 and is not directly in contact with the substrate 3.

Forming the coupling member 5 in an L-shape allows the supporting member 4 to be placed on an X-Y plane and the sensor element 2 to be placed on one plane (X-Z plane) of a portion protruding in the Z direction, thus providing a sensor device 1 having a structure in which the sensor element 2 is not directly disposed on the supporting member 4. Compared to a situation where the sensor element 2 is stacked on the supporting member 4 and placed on the portion protruding in the Z direction, the height of the sensor device 1 may be reduced because the supporting member 4 and the sensor element 2 are separated from each other structurally and the height in the Z direction depends on the sensor element 2. Furthermore, reducing the height of the sensor device 1 enables shortening the length of the bonding wires 6 that connect the supporting member 4 and the sensor element 2 together. Shortening the length of the bonding wires 6 enables reducing the deformation of the bonding wires 6 due to the shock applied to the sensor device 1, for example. In addition, avoiding stacking the sensor element 2 on the supporting member 4 (implemented as an ASIC in this embodiment) eliminates the need to bond or press the sensor element 2 onto the ASIC, thus reducing the damage to be done onto the circuit.

The bonding wires 6 form at least part of a connection path 60 that electrically connects the sensor element 2 to the supporting member 4. In particular, in this embodiment, the bonding wires 6 electrically connect the supporting member 4 to the sensor element 2. That is to say, in this embodiment, electrical connection between the supporting-end electrodes 602 of the supporting member 4 implemented as an ASIC and the sensor-end electrodes 604 of the sensor element 2 is established via the bonding wires 6. In addition, in this embodiment, electrical connection between feed electrode 603 of the supporting member 4 and the substrate-end electrodes 601 of the substrate 3 is established via the second bonding wires 61. Specifically, one end portion of each bonding wire 6 is connected to an associated one of the sensor-end electrodes 604 of the sensor element 2 and the other end portion of each bonding wire 6 is connected to an associated one of the supporting-end electrodes 602 of the supporting member 4, thus electrically connecting the sensor element 2 to the supporting member 4. Meanwhile, one end portion of each second bonding wire 61 is connected to an associated one of the feed electrodes 603 of the supporting member 4 and the other end portion of each second bonding wire 61 is connected to an associated one of the substrate-end electrodes 601 of the substrate 3, thus electrically connecting the supporting member 4 to the substrate 3.

The bonding wires 6 are bonded to the sensor-end electrodes 604 and the supporting-end electrodes 602 by either wedge bonding or ball bonding. The second bonding wires 61 are bonded to the feed electrode 603 and the substrate-end electrodes 601 by either wedge bonding or ball bonding. In this embodiment, the wedge bonding technique, by which the bonding wires 6 are bonded to the electrodes (namely, the sensor-end electrodes 604 and the supporting-end electrodes 602) and the second bonding wires 61 are bonded to the electrodes (namely, the substrate-end electrodes 601 and the feed electrode 603) by applying energy such as an ultrasonic wave or heat to bonding parts, may be adopted, for example.

The connection path 60 that electrically connects the sensor element 2 to the supporting member 4 includes the bonding wires 6, the sensor-end electrodes 604, and the supporting-end electrodes 602. That is to say, the sensor-end electrodes 604 of the sensor element 2 are connected to the supporting-end electrodes 602 of the supporting member 4 via the bonding wires 6, and the supporting-end electrodes 602 are connected to an internal circuit (processor circuit 43) of the supporting member 4 implemented as an ASIC. Thus, the connection path 60 includes not only the bonding wires 6, the sensor-end electrodes 604, and the supporting-end electrodes 602 but also the internal circuit (processor circuit 43) of the supporting member 4 implemented as an ASIC as well. In short, in this embodiment, the bonding wires 6 form part of the connection path 60 that electrically connects the sensor element 2 to the supporting member 4.

In this embodiment the bonding wires 6 are provided to connect together two connection surfaces that are one surface of the sensor element 2 and one surface of the supporting member 4 and that intersect with each other. Specifically, the bonding wires 6 connect together the supporting surface 41 that is the connection surface of the supporting member 4 and the electrode surface 24 that is the connection surface of the sensor element 2. That is to say, the two connection surfaces that are connected together via the bonding wires 6 and that intersect with each other are the electrode surface 24 that is one surface of the sensor element 2 and the supporting surface 41 that is one surface of the supporting member 4.

More specifically, both end portions of each bonding wire 6 are respectively connected to an associated one of the supporting-end electrodes 602 provided for the supporting member 4 and an associated one of the sensor-end electrodes 604 provided for the sensor element 2. That is to say, the sensor element 2 includes, on the electrode surface 24 serving as one connection surface, the sensor-end electrodes 604, to each of which an associated one of the bonding wires 6 has one end portion thereof connected. The supporting member 4 includes, on the supporting surface 41 serving as the other connection surface, the supporting-end electrodes 602, to each of which an associated one of the bonding wires 6 has the other end portion thereof connected. Also, the two connection surfaces (namely, the electrode surface 24 and the supporting surface 41) provided with the sensor-end electrodes 604 and the supporting-end electrodes 602, respectively, intersect with each other. In this embodiment, the two connection surfaces (namely, the electrode surface 24 and the supporting surface 41) intersect with each other at generally right angles.

In short, in this embodiment, the two connection surfaces (namely, the electrode surface 24 and the supporting surface 41) that intersect with each other (e.g., at right angles in this embodiment) are directly connected together via the bonding wires 6. This makes, compared to a situation where the two connection surfaces (namely, the electrode surface 24 and the supporting surface 41) that intersect with each other are connected together via a wiring member such as a lead frame or a flexible flat cable, the stress transferrable much less easily between the two connection surfaces. That is to say, in the sensor device 1 according to this embodiment, the wiring member that connects together the two connection surfaces intersecting with each other is the bonding wires 6. Thus, the stress applied from one connection surface is relaxed by the bonding wires 6, and therefore, is transferrable much less easily to the other connection surface.

In addition, according to this embodiment, no additional wiring members but the bonding wires 6 are required to connect together the two connection surfaces (namely, the electrode surface 24 and the supporting surface 41), thus reducing the number of seams of the connection path 60. That is to say, a configuration, in which each of two connection surfaces intersecting with each other is connected to a lead frame via bonding wires and the two connection surfaces are connected together with at least one pair of bonding wires and the lead frame, requires an additional wiring member other than the bonding wires. In contrast, according to this embodiment, the two connection surfaces are directly connected together via the bonding wires 6, thus requiring no additional wiring members but the bonding wires 6 and reducing the number of the seams of the connection path 60 as well.

Furthermore, in this embodiment, the sensor-end electrodes 604 are located in a region, closer to the substrate 3, of the electrode surface 24. In other words, the sensor-end electrodes 604 are located at an end portion, located closer to the substrate 3, of the electrode surface 24 (i.e., the lower end portion in FIG. 4B). This makes one end portion of each bonding wire 6 connected to a region, located closer to the substrate 3, of the electrode surface 24 as viewed from the sensor element 2. This allows the bonding wires 6 to have a relatively short length.

In this embodiment, the sensor device 1 includes a plurality of (e.g., eighteen in the example illustrated in FIG. 1A) bonding wires 6 as described above. Each of the two connection surfaces that intersect with each other is provided with a plurality of electrodes, to which the plurality of bonding wires 6 are connected. The plurality of electrodes are arranged in line that is parallel to both of the two connection surfaces. In this embodiment, the two connection surfaces to be connected together via the plurality of bonding wires 6 are the electrode surface 24 and the supporting surface 41 as described above. The electrode surface 24 is provided with the sensor-end electrodes 604 as a plurality of electrodes, to which the plurality of bonding wires 6 are connected as shown in FIG. 1. The supporting surface 41 is provided with the supporting-end electrodes 602 as a plurality of electrodes, to which the plurality of bonding wires 6 are connected as shown in FIG. 1. That is to say, on the electrode surface 24 as one connection surface, a plurality of (e.g., eighteen in the example illustrated in FIG. 1A) sensor-end electrodes 604 are provided and arranged along a line (i.e., X-axis) that is parallel to both of the two connection surfaces (namely, the electrode surface 24 and the supporting surface 41). Likewise, on the supporting surface 41 as the other connection surface, a plurality of (e.g., eighteen in the example illustrated in FIG. 1A) supporting-end electrodes 602 are provided and arranged along a line (i.e., X-axis) that is parallel to both of the two connection surfaces (namely, the electrode surface 24 and the supporting surface 41).

In this manner, the plurality of electrodes (i.e., the sensor-end electrodes 604 or the supporting-end electrodes 602) provided for each of the two connection surfaces (namely, the electrode surface 24 and the supporting surface 41) are arranged in line along the X-axis that is parallel to both of the two connection surfaces. Therefore, the plurality of bonding wires 6 that electrically connect the sensor-end electrodes 604 and the supporting-end electrodes 602 are arranged along the X-axis as shown in FIG. 1A. This allows a dispersion in length between the plurality of bonding wires 6 to be reduced eventually.

The case 7 (see FIG. 2) is bonded to the substrate 3. The case 7 houses at least the sensor element 2 between the installation surface 31 of the substrate and the case 7 itself. The case 7 may be made of a metallic material, for example. The case 7 is fixed to the installation surface 31 of the substrate 3, thus forming, between the case 7 and the installation surface 31 of the substrate 3, a space to house the sensor element 2, the supporting member 4, the coupling member 5, and the bonding wires 6.

As shown in FIG. 2, the case 7 includes a case body 71 and a flange portion 72. The case body 71 is formed in the shape of a box, one surface of which (i.e., one surface facing the substrate 3) is open in the Z-axis direction. Each corner portion of the case body 71 has a rounded shape with curvature. The flange portion 72 is a portion protruding outward from an outer peripheral edge of the opening of the case body 71. Bonding the flange portion 72 of the case 7 onto the rib 33 of the substrate 3 allows the case 7 to be bonded onto the substrate 3. As a means for fixing (bonding) the case 7 onto the substrate 3, any appropriate means such as adhesion, pressure-sensitive adhesion, brazing, welding, or crimping may be adopted. In this embodiment, a means for fixing the case 7 to the substrate 3 may be adhesion, for example.

In this embodiment, the case 7 is hermetically bonded to the substrate 3, thereby forming a hermetically sealed space between the case 7 and the installation surface 31 of the substrate 3. Thus, the sensor element 2 and other members are housed in the hermetically sealed space. This allows the sensor device 1 to reduce the chances of the sensor element 2 being affected by humidity, for example.

The sensor device 1 according to this embodiment includes the processor circuit 43 as shown in FIGS. 4A and 4B. In this embodiment, the processor circuit 43 is provided for the ASIC serving as the supporting member 4. The processor circuit 43 performs processing on an electrical signal output from the sensor element 2. In this embodiment, the processor circuit 43 is provided for the supporting member 4. In other words, the supporting member 4 includes the processor circuit 43 for performing processing on the electrical signal output from the sensor element 2.

In this embodiment, the processor circuit 43 converts an analog electrical signal (analog signal) output from the sensor element 2 into a digital signal. The processor circuit 43 performs an appropriate type of processing such as noise reduction and temperature compensation. In addition, the processor circuit 43 further provides a drive signal for driving the sensor element 2 to the sensor element 2.

Optionally, the processor circuit 43 may also perform computing processing such as integration process or differentiation process. For example, making the processor circuit 43 perform integration process on the electrical signal output from the sensor element 2 allows the sensor device 1 to obtain an integral value of the angular velocity around the Y-axis, i.e., the angle around the Y-axis. On the other hand, making the processor circuit 43 perform differentiation process on the electrical signal output from the sensor element 2 allows the sensor device 1 to obtain a differential value of the angular velocity around the Y-axis, i.e., the angular acceleration around the Y-axis.

Next, it will be described how to mount the sensor device 1 according to this embodiment onto the mount board 10.

As described above, in this embodiment, the sensor device 1 is supposed to be flip-chip bonded onto the mount board 10 with the mounting surface 32 of the substrate 3 facing toward the mount board 10 such a printed wiring board. That is to say, the sensor device 1 is mounted onto the mount board 10 with the mounting surface 32 of the substrate 3 arranged to face the one surface 101 of the mount board 10.

(3) Operation

Figure 5A:
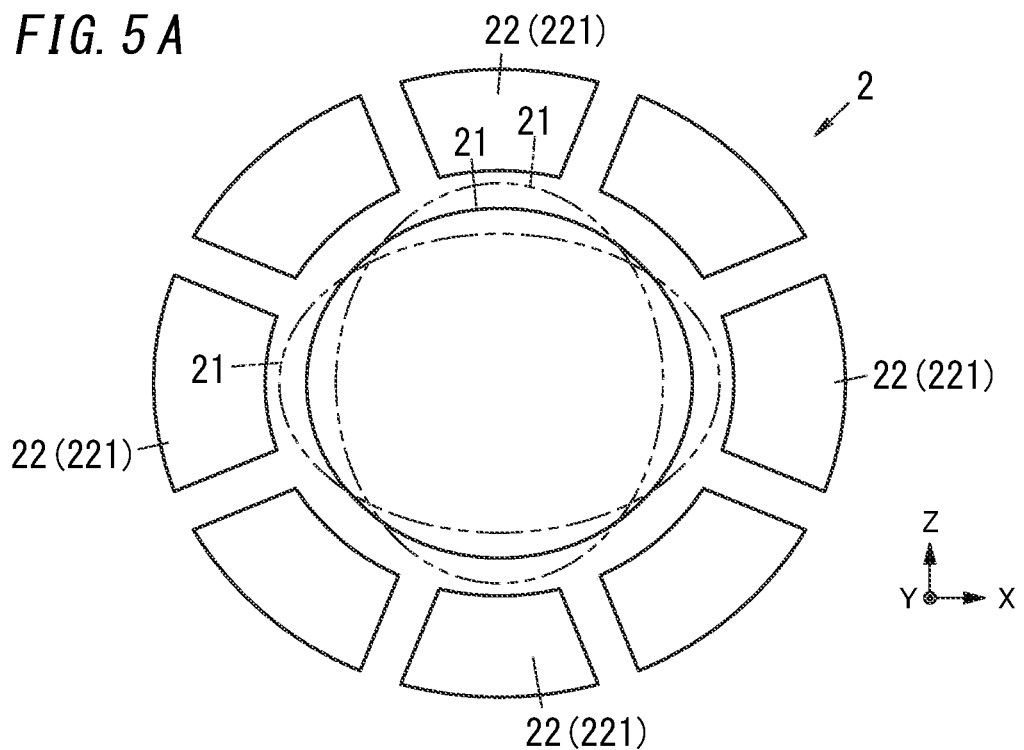
FIGS. 5A and 5B are conceptual diagrams illustrating the operating principle of a sensor element of the sensor device.
Figure 5B:
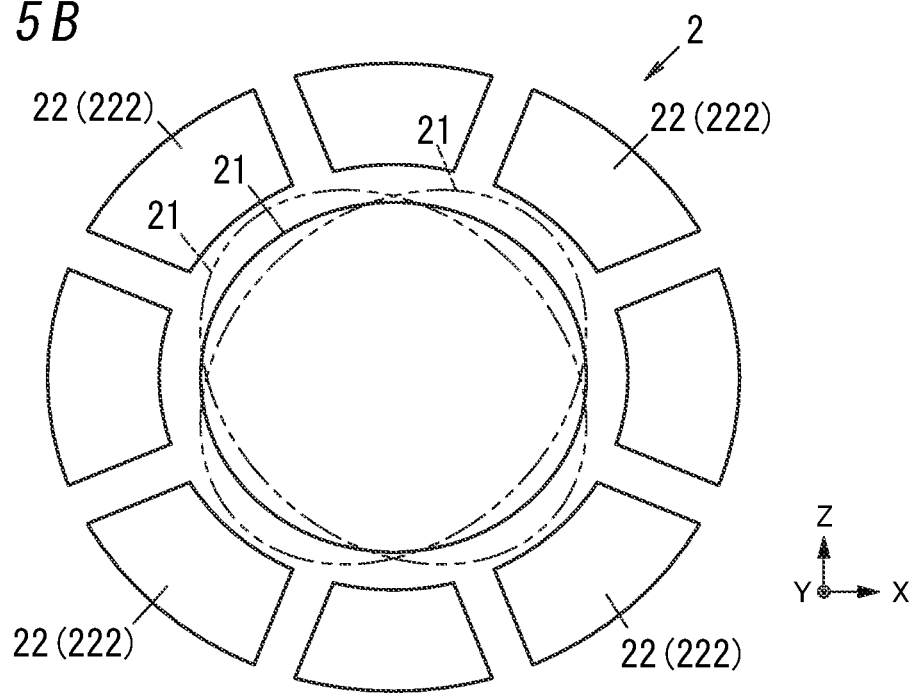

Next, a configuration for the sensor element 2 will be described with reference to FIGS. 5A and 5B. FIGS. 5A and 5B are conceptual diagrams illustrating the operating principle of the sensor element 2.

In this embodiment, the sensor element 2 may be implemented as, for example, a capacitive bulk ultrasonic disk gyroscope to be driven at radio frequencies (falling within the MHz band). This gyroscope (sensor element 2) includes a base plate, a moving portion 21, and a plurality of electrodes 22.

The moving portion 21 is supported over the base plate with an insulating layer interposed between them. The plurality of electrodes 22 are arranged around the moving portion 21 to surround the moving portion 21. A very narrow gap is left between each electrode 22 and the moving portion 21. These electrodes 22 may excite and detect at least two modified bulk ultrasonic resonance modes in the moving portion 21.

The moving portion 21 is a resonator, which is formed in a disk shape, which is circular in plan view. In this embodiment, the moving portion 21 is made of a non-piezoelectric material such as single crystalline or polycrystalline silicon and does not have to be made of a piezoelectric material. Alternatively, the moving portion 21 may also be made of: a semiconductor such as silicon carbide, gallium nitride, aluminum nitride, or quartz; or a metallic material.

The plurality of electrodes 22 includes driving electrodes 221 and detecting electrodes 222. The moving portion 21 is deformed, by precession movement, between the driving mode shown in FIG. 6A and the detection mode shown in FIG. 6B. That is to say, the disklike moving portion 21 vibrates, within a plane perpendicular to the center axis thereof (i.e., an axis parallel to the Y-axis), so as to repeat deformations including alternate expansion and contraction in two orthogonal directions. The sensor element 2 outputs, as an electrical signal, the magnitude of deformation (magnitude of movement) of the moving portion 21. That is to say, the magnitude of the deformation of the moving portion 21 manifests itself as a variation in capacitance between the moving portion 21 and the detecting electrode 222. Thus, the sensor element 2 outputs an electrical signal representing this variation in capacitance.

(4) Advantage

A sensor device contributing to increasing the degree of freedom in shape or dimensions may be provided. In addition, separating the sensor element 2 from the supporting member 4 also contributes to reducing the height, compared to a situation where the sensor element 2 is not separated from the supporting member 4. This may shorten the length of the bonding wires 6 and thereby reduce the vibrations and deformation of the bonding wires 6. Furthermore, the harmful effect to be caused to an ASIC by attaching the sensor element 2 onto the ASIC may also be eliminated.

(5) Variations

Note that the first embodiment described above is only an exemplary one of various embodiments of the present disclosure and should not be construed as limiting. The drawings that have been referred to in the foregoing description of the first embodiment are all schematic representations. That is to say, the ratio of the dimensions (including thicknesses) of respective constituent elements illustrated on the drawings does not always reflect their actual dimensional ratio. Rather, the first embodiment may be readily modified in various manners depending on a design choice or any other factor without departing from the scope of the present disclosure. Note that the variations to be described below may be adopted in combination as appropriate.

(5-1) First variation

Figure 7:
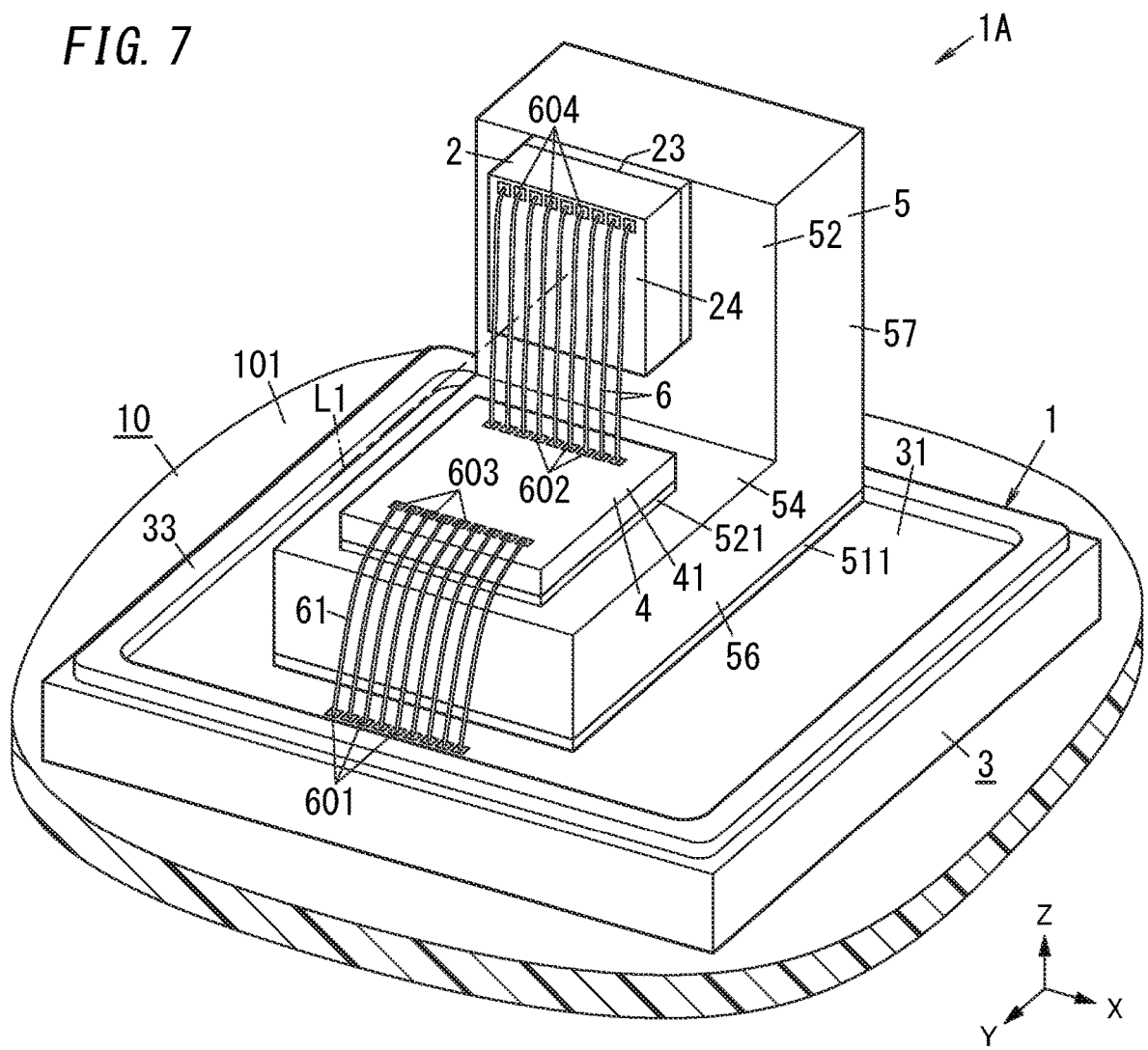
FIG. 7 is a perspective view illustrating a configuration for a sensor device according to a first variation of the first embodiment, from which a case is removed.

In a sensor device 1A according to a first variation of the first embodiment, the sensor-end electrodes 604 of the sensor element 2 are provided at different positions as shown in FIG. 7 from the sensor device 1 according to the first embodiment. Specifically, in the sensor device 1 according to the first embodiment, the sensor-end electrodes 604 are provided in a region, located closer to the substrate 3, of the sensor element 2. In this variation, the sensor-end electrodes 604 are provided in a region, located opposite from the substrate 3, of the sensor element 2.

In this variation, the sensor-end electrodes 604 are located on the end portion (i.e., the upper end portion in FIG. 7), opposite from the substrate 3, of the coupling member 5 having an L-shape in an X-Z plane protruding in the Z direction. Thus, one end portion of each bonding wire 6 is connected to the upper end portion of the sensor element 2 in the Z direction (i.e., the other end portion located opposite from the substrate 3).

The sensor device 1A according to this variation ensures a sufficient distance between the sensor-end electrodes 604 and the supporting-end electrodes 602 of the supporting member 4, thus making it easier to avoid interference between the bonding wires 6 and the supporting member 4 even without leaving the gap G1 (see FIG. 4B) between the sensor element 2 and the supporting member 4. This allows the sensor element 2 to be arranged to have the lower end portion thereof brought closer to the end portion, located adjacent to the substrate 3, on the second surface 52, thus allowing the coupling member 5 to have a reduced Z-axis dimension. Consequently, this makes the protrusion height of the coupling member 5 from the installation surface 31 of the substrate 3 relatively small and eventually makes the overall Z-axis dimension (height) of the sensor device 1A relatively small as well, thus contributing to reducing the height of the sensor device 1A.

(5-2) Other Variations

Next, variations other than the first variation will be enumerated one after another.

In the first embodiment described above, the sensor element 2 detects an angular velocity around the Y-axis. However, this configuration is only an example and should not be construed as limiting. Alternatively, the sensor element 2 may also detect an angular velocity around the X-axis or around the Z-axis. Still alternatively, the sensor element 2 may also be configured to detect angular velocities around two or more axes, not just an angular velocity around a single axis. For example, the sensor element 2 may also be implemented as a triaxial angular velocity sensor for detecting angular velocities around the X-, Y-, and Z-axes, respectively. That is to say, the sensor element 2 needs to detect an angular velocity around at least one axis.

The sensor element 2 may also be configured to detect any physical quantity other than angular velocity. For example, the sensor element 2 may also be configured to detect any other physical quantity such as acceleration, angular acceleration, velocity, pressure, weight, length (distance), or temperature. Furthermore, the sensor element 2 does not have to detect a single physical quantity but may also be configured to detect a plurality of physical quantities. For example, the sensor element 2 may detect angular velocity and acceleration.

Furthermore, the sensor element 2 does not have to be an element that utilizes the MEMS technology but may also be any other type of element.

Furthermore, the number of the spacers 53 provided for the coupling member 5 does not have to be four but may also be one, two, three, or five or more. Furthermore, each spacer 53 does not have to have a dome shape but may also have a circular columnar, polygonal prismatic, conical, polygonal pyramidal, spherical, or any other appropriate shape.

Furthermore, in the first embodiment described above, the sensor device 1 is supposed to be flip-chip bonded onto the mount board 10. However, the sensor device 1 does not have to be flip-chip bonded. For example, the sensor device 1 may also be configured to be surface-mounted (such as wire-bonded) instead of being flip-chip bonded (e.g., mounted faceup with the electrode portion facing upward and connected via the bonding wires 6) or insertion-mounted onto the mount board 10 by providing lead terminals for the substrate 3.

Furthermore, the substrate 3 does not have to have the shape, or be made of the material, described for the first embodiment. For example, the substrate 3 may also have a rectangular or circular shape in plan view. Furthermore, the substrate 3 does not have to be made of a ceramic but may also be made of a resin or silicon, for example.

Furthermore, the supporting member 4 implemented as an ASIC including the processor circuit 43 is not an essential constituent element for the sensor device 1. The supporting member 4 does not have to include any electronic component but may also be a structure such as a simple plate member. Furthermore, the supporting member 4 does not have to have the shape, or be made of the material, described for the first embodiment. For example, the supporting member 4 may also have a rectangular or circular shape in plan view. Furthermore, the supporting member 4 may also be a member made of a resin, silicon, or a ceramic, for example.

Furthermore, the coupling member 5 does not have to have the shape, or be made of the material, described for the first embodiment. For example, the coupling member 5 may also have a cubic shape or a polygonal prismatic shape (such as a triangular prismatic shape or a hexagonal prismatic shape). Furthermore, the coupling member 5 does not have to be made of an LCP resin but may also be made of silicon, a metal, or a ceramic, for example.

Optionally, the connection path 60 may include an electrically conductive path formed on the surface of the coupling member 5 or an electrically conductive path embedded in the coupling member 5.

Furthermore, the coupling member 5 may have a hollow structure. This allows the shock applied to the coupling member 5 to be absorbed more easily compared to the coupling member 5 with a solid structure. This contributes to improving the shock absorbance of the sensor device 1.

(Second Embodiment)

Figure 6A:
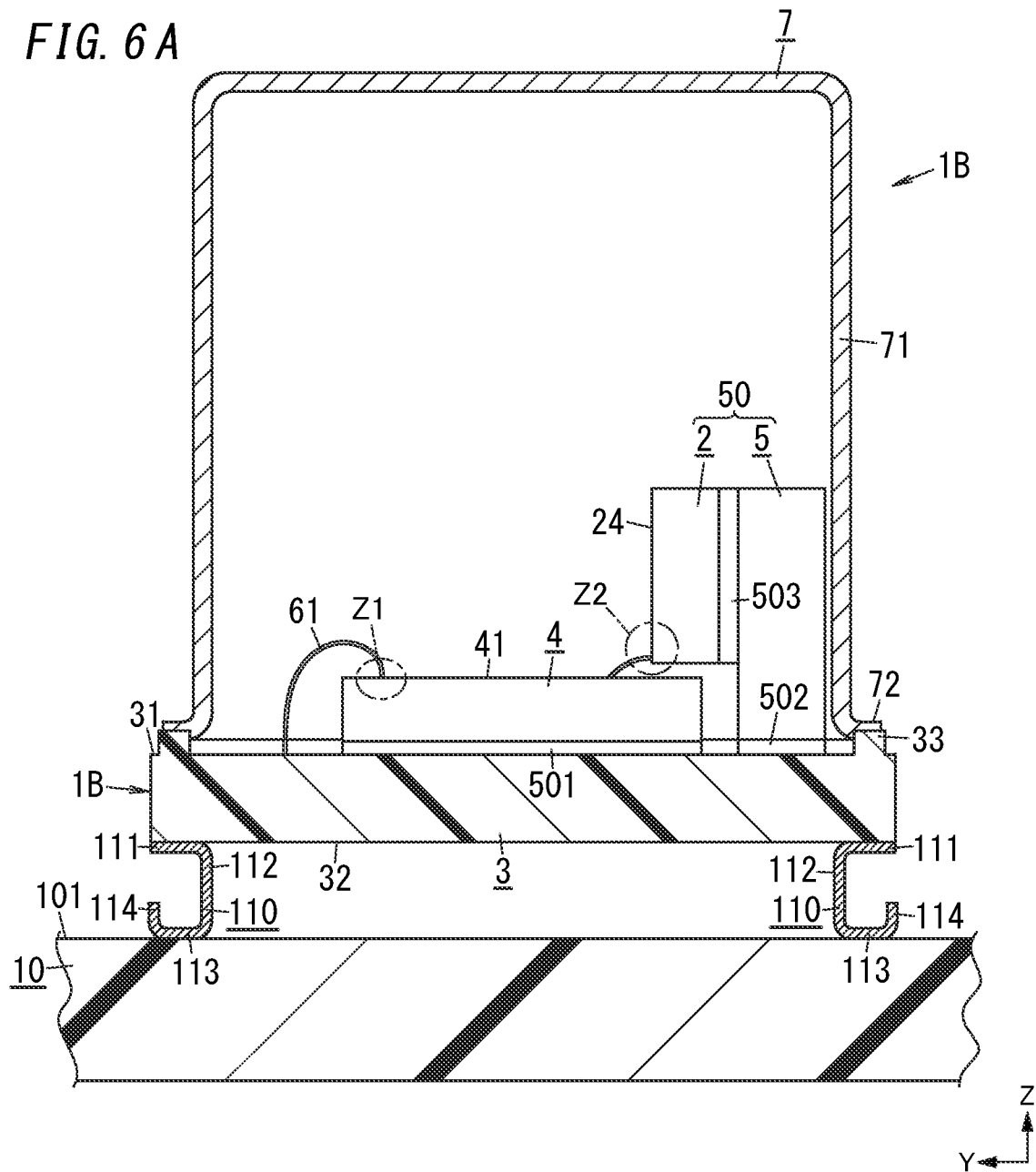
FIG. 6A is a partially cutaway side view of a sensor device according to a second embodiment.

A sensor device 1B according to a second embodiment includes a coupling member 5 having a different shape as shown in FIG. 6A from its counterpart of the sensor device 1 according to the first embodiment. In the following description, any constituent element of this second embodiment, having the same function as a counterpart of the first embodiment described above, will be designated by the same reference numeral as that counterpart's, and description thereof will be omitted herein as appropriate.

Figure 6B:
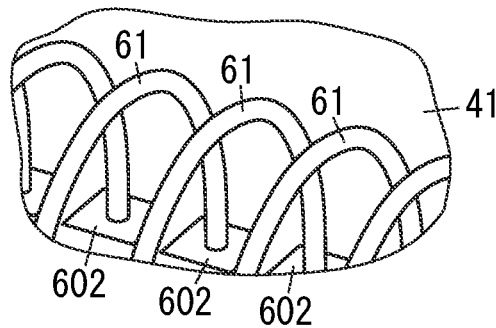
FIG. 6B is an enlarged view of a region Z1 shown in FIG. 6A.
Figure 6C:
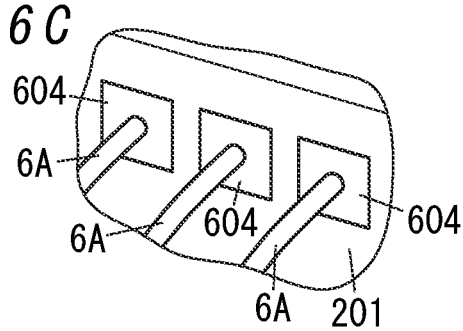
FIG. 6C is an enlarged view of a region Z2 shown in FIG. 6A.

In the sensor device 1B according to this embodiment, the relative position of the supporting member 4 with respect to the substrate 3 is different as shown in FIGS. 6A-6C from the sensor device 1 according to the first embodiment. In the following description, any constituent element of this second embodiment, having the same function as a counterpart of the first embodiment described above, will be designated by the same reference numeral as that counterpart's, and description thereof will be omitted herein as appropriate. FIG. 6B is an enlarged perspective view corresponding to a region Z1 shown in FIG. 6A. FIG. 6C is an enlarged perspective view corresponding to a region Z2 shown in FIG. 6A.

In this embodiment, the substrate 3 and the supporting member 4 are bonded together to have such a positional relationship that the supporting surface 41 is aligned with the installation surface 31 as shown in FIG. 6A. In particular, in the example illustrated in FIG. 6A, the supporting surface 41 and the installation surface 31 are generally parallel to each other. Also, in this embodiment, the sensor element 2 is supported over the installation surface 31 of the substrate 3 via the coupling member 5. The sensor element 2 is fixed on the second surface 52 of the coupling member 5. The sensor element 2 is formed in a flat plate shape and has a thickness in the Y-axis direction. The sensor element 2 has an electrode surface 24 on one surface (opposite from the coupling member 5) along the thickness thereof. That is to say, the installation surface 23 of the sensor element 2 faces the coupling member 5.

More specifically, the coupling member 5 is provided on the installation surface 31 of the substrate 3 to couple the sensor element 2 to the substrate 3. In other words, the sensor element 2 is installed (mounted) and fixed onto the installation surface 31 of the substrate 3 via the coupling member 5. Thus, the relative positions of the substrate 3 and the sensor element 2 are defined by the coupling member 5. In the sensor device 1B according to this embodiment, the positional relationship between the substrate 3 and the sensor element 2 is defined such that a normal to the electrode surface 24 of the sensor element 2 is aligned with the supporting surface 41. That is to say, the normal to the electrode surface 24 is generally parallel to the supporting surface 41 of the supporting member 4 (i.e., may be exactly parallel to the supporting surface 41 or to form an angle of about several degrees with respect to the supporting surface 41). In this embodiment, the normal to the electrode surface 24 may be, for example, exactly parallel to the supporting surface 41 of the supporting member 4 and the installation surface 31 of the substrate 3.

In addition, the configuration described above allows the coupling member 5 and the sensor element 2 to be fixed to stand upright on the installation surface 31 of the substrate 3. In other words, a vertical member 50 including the sensor element 2 is provided to stand upright on the installation surface 31 of the substrate 3. In this embodiment, the vertical member 50 provided on the installation surface 31 of the substrate 3 includes the sensor element 2 and the coupling member 5.

As a means for fixing the supporting member 4 onto the installation surface 31 of the substrate 3, any appropriate means such as adhesion, pressure-sensitive adhesion, brazing, welding, or crimping may be adopted, for example. In this embodiment, a means for fixing the supporting member 4 to the substrate 3 maybe, for example, adhesion with an adhesive layer 501. Likewise, as a means for fixing the coupling member 5 onto the installation surface 31 of the substrate 3, any appropriate means such as adhesion, pressure-sensitive adhesion, brazing, welding, or crimping may be adopted, for example. In this embodiment, a means for fixing the coupling member 5 to the substrate 3 may be, for example, adhesion with an adhesive layer 502. Likewise, as a means for fixing the sensor element 2 to the second surface 52 of the coupling member 5, any appropriate means such as adhesion, pressure-sensitive adhesion, brazing, welding, or crimping may be adopted, for example. In this embodiment, a means for fixing the sensor element 2 to the second surface 52 of the coupling member 5 may be, for example, adhesion with an adhesive layer 503.

In addition, the supporting member 4 further includes a plurality of supporting-end electrodes 602 and a plurality of feed electrodes 603 as shown in FIG. 6B. The feed electrodes 603 are made of an electrically conductive material. The feed electrodes 603 are electrodes, to which the bonding wires 61 are electrically connected, and are formed on the supporting surface 41. That is to say, the supporting member 4 includes, on the supporting surface 41, the feed electrodes 603, to each of which one end portion of an associated one of the bonding wires 6A is connected. In this embodiment, the supporting-end electrodes 602 and the feed electrodes 603 are provided on the same surface (supporting surface 41) of the supporting member 4.

In addition, the sensor element 2 further includes a plurality of sensor-end electrodes 604 as shown in FIG. 6C. The sensor-end electrodes 604 are made of an electrically conductive material. The sensor-end electrodes 604 are electrodes, to which the bonding wires 6A are electrically connected, and are formed on the electrode surface 24. In other words, the sensor element 2 includes, on the electrode surface 24, the sensor-end electrodes 604, to each of which one end portion of an associated one of the bonding wires 6A is connected.

The bonding wires 6A form at least part of a connection path 60 (see FIG. 1A) that electrically connects the sensor element 2 to the substrate 3. In particular, in this embodiment, the bonding wires 6A electrically connect the sensor element 2 and the supporting member 4 together. That is to say, in this embodiment, electrical connection between the (sensor-end electrodes 604 of the) sensor element 2 and the (supporting-end electrodes 602 of the) supporting member 4 implemented as an ASIC is established by the bonding wires 6A. Specifically, connecting one end portion of each bonding wire 6A to an associated one of the supporting-end electrodes 602 of the supporting member 4 and the other end portion of the bonding wire 6A to an associated one of the sensor-end electrodes 604 of the sensor element 2 allows the bonding wires 6A to electrically connect the supporting member 4 and the sensor element 2 together.

The connection path 60 that electrically connects the sensor element 2 and the substrate 3 together includes not only the bonding wires 6A serving as "first bonding wires" but also bonding wires 61 serving as "second bonding wires." The second bonding wires 61 electrically connect the supporting member 4 and the substrate 3 together. That is to say, in this embodiment, electrical connection between the (feed electrodes 603 of the) supporting member 4 implemented as an ASIC and the substrate 3 is established by the second bonding wires 61. Specifically, connecting one end portion of each bonding wire 61 to an associated one of the substrate-end electrodes 601 of the substrate 3 and the other end portion of the bonding wire 61 to an associated one of the feed electrodes 603 of the supporting member 4 allows the bonding wires 61 to electrically connect the substrate 3 and the supporting member 4 together.

The (first) bonding wires 6A are bonded to the supporting-end electrodes 602 and the sensor-end electrode 604 by either wedge bonding or ball bonding. In this embodiment, the wedge bonding technique, by which the bonding wires 6A are bonded to the electrodes (namely, the supporting-end electrodes 602 and the sensor-end electrodes 604) by applying energy such as an ultrasonic wave or heat to bonding parts, may be adopted, for example. In the same way, the second bonding wires 61 may also be bonded by either wedge bonding or ball bonding.

In this embodiment the (first) bonding wires 6A are provided to connect together two connection surfaces that are one surface of the supporting member 4 and one surface of the sensor element 2 and that intersect with each other. Specifically, the bonding wires 6A connect together the supporting surface 41 that is the connection surface of the supporting member 4 and the electrode surface 24 that is the connection surface of the sensor element 2.

As can be seen, in the sensor device 1B according to this embodiment, the supporting surface 41 and the electrode surface 24 intersect with each other (e.g., at right angles in this embodiment). One of the two connection surfaces (one connection surface) that intersect with each other is the supporting surface 41 that is one surface of the supporting member 4. The other of the two connection surfaces (the other connection surface) intersecting with each other is the electrode surface 24 that is one surface of the sensor element 2. That is to say, the two connection surfaces, which intersect with each other and which are connected together via the bonding wires 6A, are the electrode surface 24 that is one surface of the sensor element 2 and the supporting surface 41 that is one surface of the supporting member 4.

In this embodiment, the adhesive layer 502 (hereinafter also referred to as a "second adhesive layer 502") bonding the vertical member 50 and the substrate 3 together has a larger Young's modulus than the adhesive layer 501 (hereinafter also referred to as a "first adhesive layer 501") bonding the supporting member 4 and the substrate 3 together. That is to say, in this embodiment, the Young's modulus of the second adhesive layer 502 serving as a fixing means between the coupling member 5 included in the vertical member 50 and the substrate 3 is larger than the Young's modulus of the first adhesive layer 501 serving as a fixing means between the supporting member 4 and the substrate 3. In other words, the second adhesive layer 502 between the coupling member 5 and the substrate 3 is more rigid and less deformable than the first adhesive layer 501 between the supporting member 4 and the substrate 3. Stated otherwise, the first adhesive layer 501 between the supporting member 4 and the substrate 3 is less rigid and more deformable than the second adhesive layer 502 between the coupling member 5 and the substrate 3.

Providing the first adhesive layer 501 and the second adhesive layer 502 having such relationship allows the coupling member 5 (vertical member 50) to be firmly fixed onto the substrate 3, thus making stress less easily transferrable from the substrate 3 to the supporting member 4. This reduces, even if external force produced by an ultrasonic wave, for example, is applied along the Y-axis to the vertical member 50 while the bonding wires 6A are being bonded to the sensor-end electrodes 604, for example, the chances of the vertical member 50 (coupling member 5) being tilted with respect to the substrate 3. This allows the external force produced by an ultrasonic wave, for example, and applied along the Y-axis to the vertical member 50 to be used efficiently for bonding the bonding wires 6A to the sensor-end electrodes 604. In addition, the stress is transferrable much less easily from the substrate 3 to the supporting member 4, thus making the stress hardly applicable to the sensor element 2. This reduces the chances of the result of detection by the sensor element 2 being affected by the stress.

Also, the second adhesive layer 502 bonding the coupling member 5 and the substrate 3 together has a larger Young's modulus than the adhesive layer 503 (hereinafter also referred to as a "third adhesive layer 503") bonding the coupling member 5 and the sensor element 2 together. That is to say, in this embodiment, the Young's modulus of the second adhesive layer 502 serving as a fixing means between the coupling member 5 included in the vertical member 50 and the substrate 3 is larger than the Young's modulus of the third adhesive layer 503 serving as a fixing means between the coupling member 5 and the sensor element 2. In other words, the second adhesive layer 502 between the coupling member 5 and the substrate 3 is more rigid and less deformable than the third adhesive layer 503 between the coupling member 5 and the sensor element 2. Stated otherwise, the third adhesive layer 503 between the coupling member 5 and the sensor element 2 is less rigid and more deformable than the second adhesive layer 502 between the coupling member 5 and the substrate 3.

Providing the third adhesive layer 503 and the second adhesive layer 502 having such relationship allows the coupling member 5 (vertical member 50) to be firmly fixed onto the substrate 3, thus making stress less easily transferrable from the coupling member 5 to the substrate 3. This reduces, even if external force produced by an ultrasonic wave, for example, is applied along the Y-axis to the vertical member 50 while the bonding wires 6A are being bonded to the sensor-end electrodes 604, for example, the chances of the vertical member 50 (coupling member 5) being tilted with respect to the supporting member 4. This allows the external force produced by an ultrasonic wave, for example, and applied along the Y-axis to the vertical member 50 to be used efficiently for bonding the bonding wires 6A to the sensor-end electrodes 604. In addition, even if stress is applied from the substrate 3 to the coupling member 5, the stress is transferrable much less easily from the coupling member 5 to the substrate 3, thus making the stress hardly applicable to the sensor element 2. This reduces the chances of the result of detection by the sensor element 2 being affected by the stress.

In addition, the sensor device 1B according to this embodiment is also mounted onto the mount board 10 differently from the sensor device 1 according to the first embodiment. Specifically, the sensor device 1 according to the first embodiment is bonded onto the mount board 10 via gold (Au) bumps or solder, for example. On the other hand, the sensor device 1B according to this embodiment is bonded onto the mount board 10 via terminal members 110.

In this embodiment, the sensor device 1B is mounted onto the mount board 10 with mounting surface 32 of the substrate 3 facing the one surface 101 of the mount board 10 as shown in FIG. 6A. Each of the terminal members 110 is a member with spring properties (i.e., elasticity) and part of the terminal member 110 is fixed to the substrate 3. In this embodiment, the terminal member 110 may be, for example, a lead terminal made of a metal with electrical conductivity (such as copper or a copper alloy). The sensor device 1B includes a plurality of terminal members 110 along the outer peripheral edges of the mounting surface 32 of the substrate 3. That is to say, the plurality of terminal members 110 are arranged along the outer peripheral edges of the mounting surface 32.

As shown in FIG. 6A, each terminal member 110 includes a first terminal piece 111, a second terminal piece 112, a third terminal piece 113, and a fourth terminal piece 114, and is formed in a generally C-shape overall. The first terminal piece 111 and the third terminal piece 113 are parallel to each other. The second terminal piece 112 couples one end of the first terminal piece 111 and one end of the third terminal piece 113 together. The fourth terminal piece 114 protrudes, from the other end, opposite from the second terminal piece 112, of the third terminal piece 113 toward the first terminal piece 111. In the terminal member 110 having such a shape, the first terminal piece 111 is connected to the mounting surface 32 of the substrate 3 with solder, for example. Meanwhile, the third terminal piece 113 is connected to the one surface of the mount board 10 with solder, for example. In this manner, the terminal member 110 has one part thereof fixed to the substrate 3 and another part thereof fixed to the mount board 10.

According to the configuration described above, to say the least, part (around the middle) of the second terminal piece 112 is connected directly to neither the substrate 3 nor the mount board 10. Thus, letting the second terminal piece 112 flex itself due to the spring properties (elasticity) of at least the second terminal piece 112 itself allows the terminal member 110 to reduce the stress transferred between the mount board 10 and the substrate 3. Thus, even if stress is applied from the mount board 10 to the terminal member 110 due to, for example, a difference in coefficient of thermal expansion between the mount board 10 and the substrate 3, the stress may be reduced by the terminal member 110 and hardly transferrable to the substrate 3, thus reducing the chances of the result of detection by the sensor element 2 being affected by the stress.

Alternatively, in this embodiment, the mounting surface 32 of the substrate 3 and the one surface 101 of the mount board 10 may also be mechanically bonded together with an underfilling material, for example.

(Variations of Second Embodiment)

Figure 8:
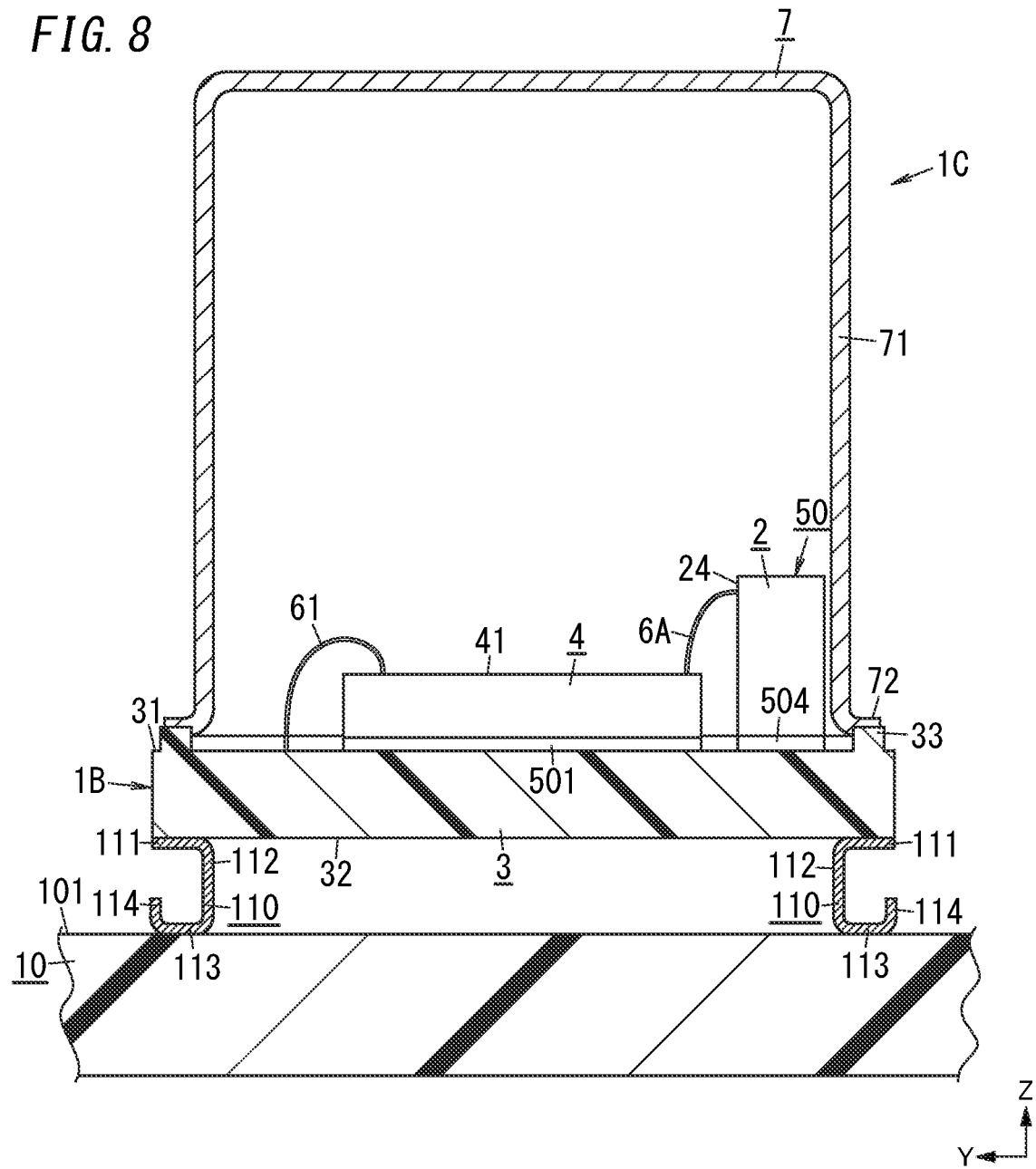
FIG. 8 is a side view illustrating a configuration for a sensor device according to a second variation of the second embodiment.

FIG. 8 illustrates a sensor device 1C according to a variation of the second embodiment. In the sensor device 1C according to this variation, the coupling member 5 is omitted. Thus, the vertical member 50 provided on the installation surface 31 is the sensor element 2 with no coupling member 5. In the following description, any constituent element of this variation, having the same function as a counterpart of the second embodiment described above, will be designated by the same reference numeral as that counterpart's, and description thereof will be omitted as appropriate herein.

In this sensor device 1C, the vertical member 50 (sensor element 2) is fixed on the substrate 3 to have such a positional relationship that a normal to the electrode surface 24 of the sensor element 2 is aligned with the supporting surface 41. In this variation, the sensor element 2 is installed directly on the installation surface 31 of the substrate 3. As a means for fixing the sensor element 2 onto the (installation surface 31 of the) substrate 3, any appropriate means such as adhesion, pressure-sensitive adhesion, brazing, welding, or crimping may be adopted, for example. In this variation, a means for fixing the sensor element 2 to the substrate 3 may be, for example, adhesion with an adhesive layer 504.

The adhesive layer 504 (hereinafter referred to as a "fourth adhesive layer 504") bonding the vertical member 50 (sensor element 2) and the substrate 3 together has a larger Young's modulus than the first adhesive layer 501 bonding the supporting member 4 and the substrate 3 together. That is to say, in this variation, the Young's modulus of the fourth adhesive layer 504 serving as a fixing means between the sensor element 2 included in the vertical member 50 and the substrate 3 is larger than the Young's modulus of the first adhesive layer 501 serving as a fixing means between the supporting member 4 and the substrate 3. In other words, the fourth adhesive layer 504 between the sensor element 2 and the substrate 3 is more rigid and less deformable than the first adhesive layer 501 between the supporting member 4 and the substrate 3.

The configuration that has been described for the second embodiment (including the variation thereof) may be adopted as appropriate in combination with various configurations described for the first embodiment (including the variations thereof).

(Third Embodiment)

Figure 9:
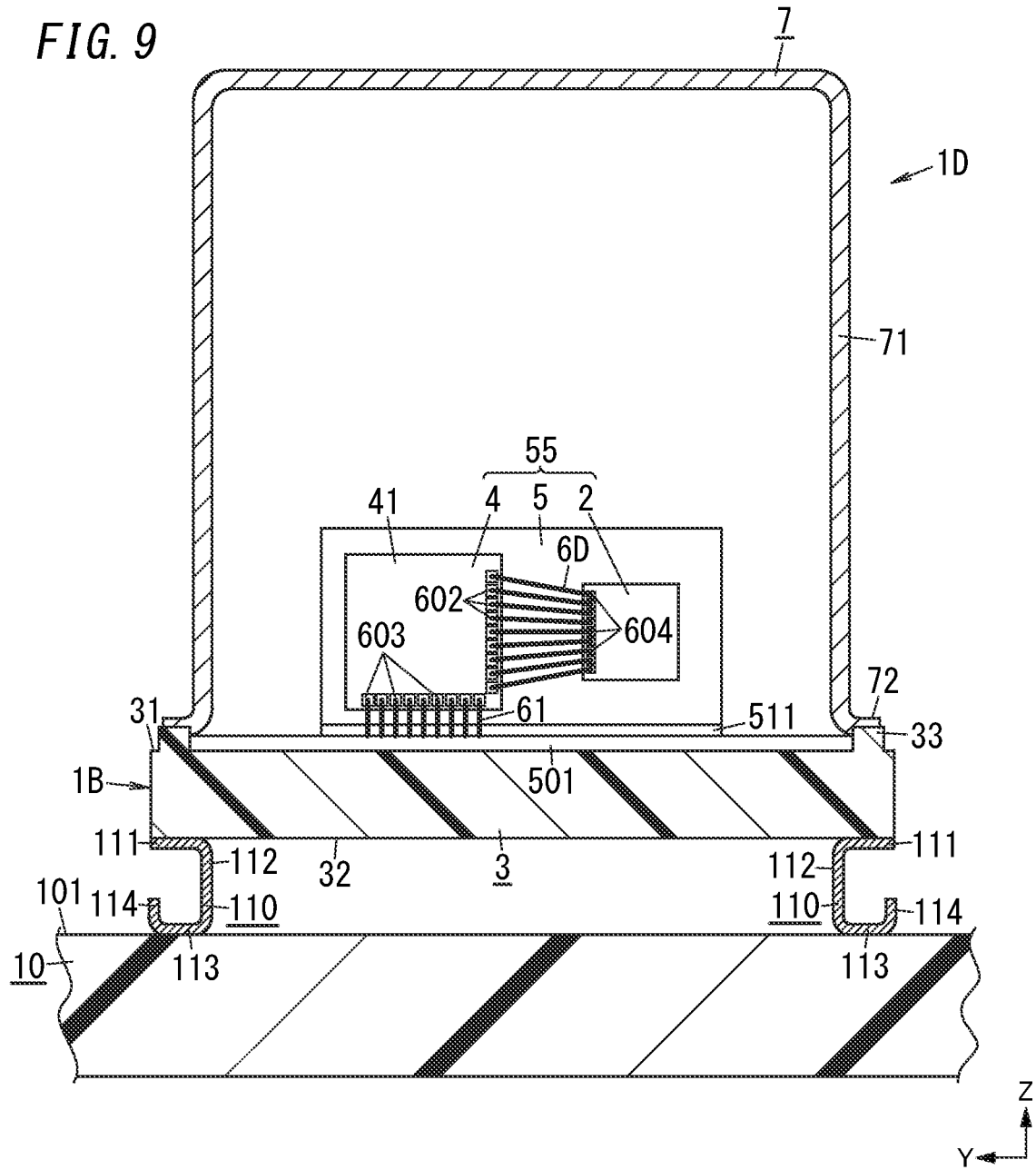
FIG. 9 is a side view illustrating a configuration for a sensor device according to a third embodiment.

In a sensor device 1D according to a third embodiment, the relative positions of the substrate 3, the supporting member 4, and the sensor element 2 are different as shown in FIG. 9 from the sensor device 1 according to the first embodiment. In the following description, any constituent element of this third embodiment, having the same function as a counterpart of the first embodiment described above, will be designated by the same reference numeral as that counterpart's, and description thereof will be omitted herein as appropriate.

In this embodiment, the coupling member 5 has a flat plate shape as shown in FIG. 9. In addition, the supporting member 4 and the sensor element 2 are arranged on the same plane on the coupling member 5 and the coupling member 5 is fixed generally perpendicularly to the installation surface 31 of the substrate 3. In other words, a vertical member 55 including the sensor element 2 and the supporting member 4 is installed to stand upright on the installation surface 31 of the substrate 3. In this case, the vertical member 55 installed on the installation surface 31 of the substrate 3 includes the sensor element 2, the supporting member 4, and the coupling member 5.

In this embodiment, the sensor element 2 and the supporting member 4 are provided on the same plane and electrically connected to each other via bonding wires 6D. Electrically connecting the sensor element 2 and the supporting member 4 on the same plane via the bonding wires 6D enables shortening the length of the bonding wires 6D. Shortening the length of the bonding wires 6D enables reducing the deformation of the bonding wires 6D when shock is applied to the sensor device 1D. In addition, shortening the length of the bonding wires 6D reduces the chances of the sensor device 1D being affected by vibrations (e.g., car shakes).

In addition, the stress applied from the substrate 3 to the sensor element 2 may be reduced by the coupling member 5.

(Variations)

Next, variations will be enumerated one after another. Optionally, the variations to be described below may be adopted as appropriate in combination with any of the embodiments described above.

In the third embodiment described above, the vertical member 55 is supposed to be fixed to the installation surface 31 of the substrate 3 so as to stand upright thereon. However, this configuration is only an example and should not be construed as limiting. Alternatively, the vertical member 55 may also be fixed to the installation surface 31 of the substrate 3 so as to be laid on the installation surface 31. This also allows the coupling member 5 to reduce the stress applied from the substrate as well as in the third embodiment. Meanwhile, the sensor element 2 may be connected to the supporting member 4 in the same way as in the third embodiment described above. Thus, the advantage to be achieved by shortening the bonding wires 6D is also the same as the one already described for the third embodiment.

(Fourth Embodiment)

Figure 10A:
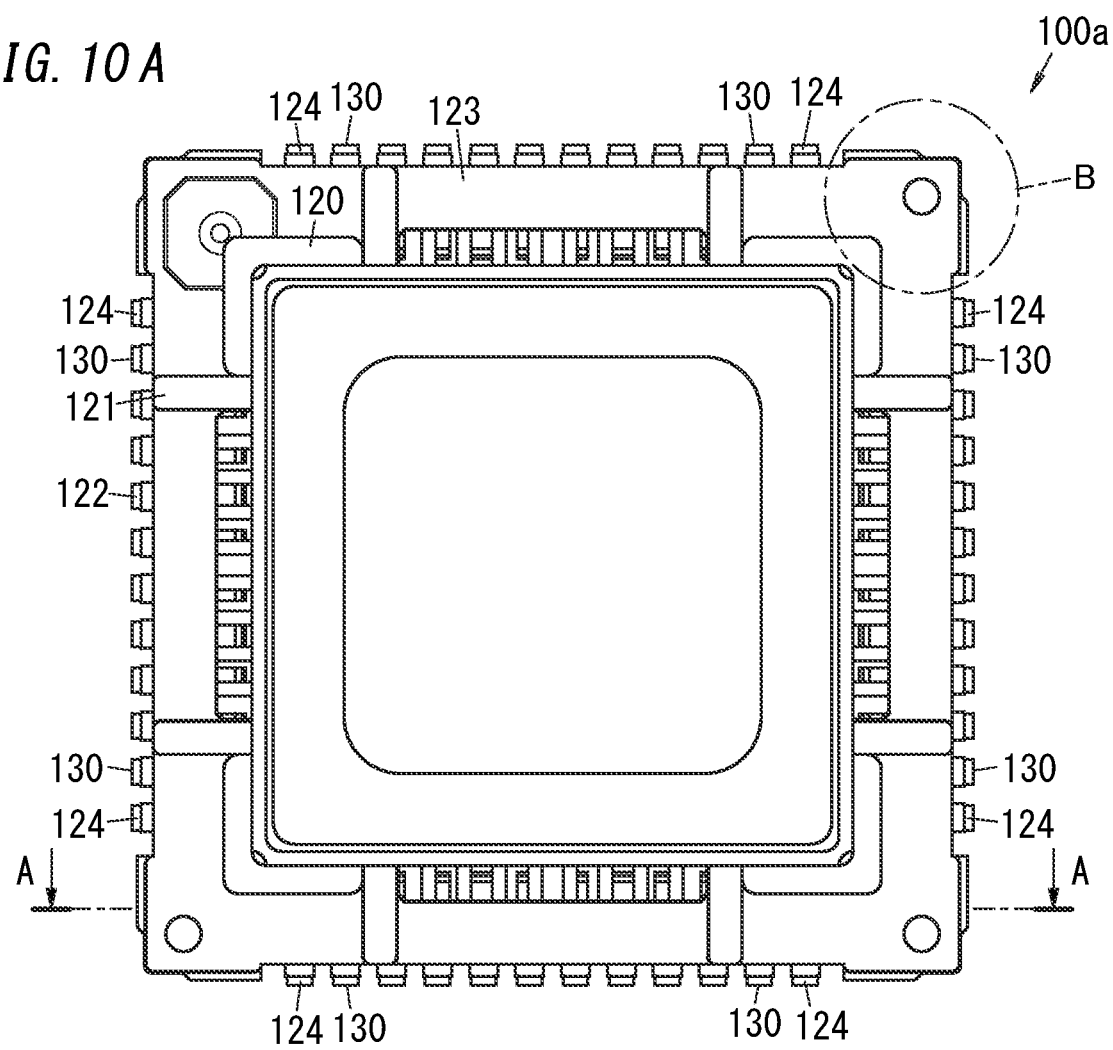
FIG. 10A is a top view of a sensor according to a fourth embodiment.

In a sensor 100a according to a fourth embodiment, the sensor device 1 is mounted onto a base, made of a molded resin, of the mount board 10a as shown in FIG. 10A, which is a major difference from the first embodiment described above. In the following description, any constituent element of this fourth embodiment, having the same function as a counterpart of the first embodiment described above, will be designated by the same reference numeral as that counterpart's, and description thereof will be omitted as appropriate herein.

The sensor 100a according to this embodiment includes the mount board 10a and the sensor device 1. The sensor device 1 is the same as its counterpart of the first embodiment and description thereof will be omitted herein.

Figure 11A:
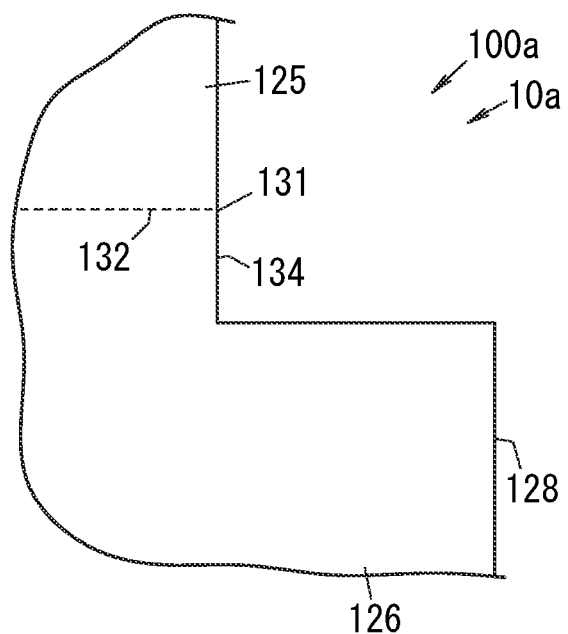
FIG. 11A is an enlarged view of a part around a positioning surface.
Figure 11B:
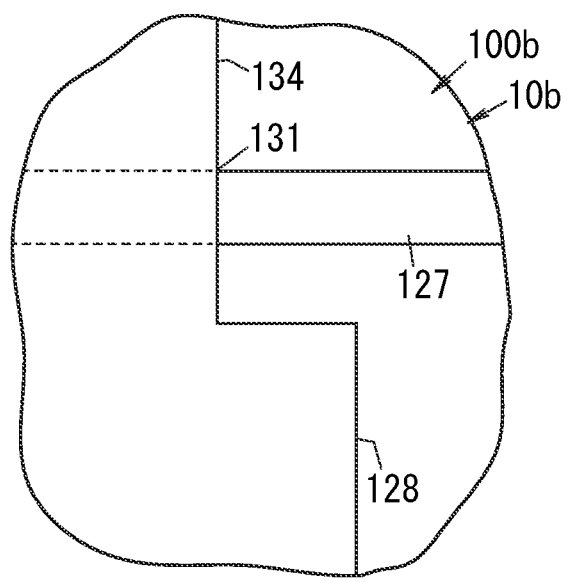
FIG. 11B is an enlarged view of a terminal and a part around the positioning surface.

The mount board 10 is a resin molded product formed by using an upper die and a lower die of a die assembly. As shown in FIGS. 11A and 11B, the mount board 10 has some regions where molding bur 131 tends to be produced. The molding bur 131 is often produced along a weld line 132 or in a region loaded with a terminal 127 (hereinafter also referred to as an "insert terminal 127"). When the sensor 100 is gripped while being mounted or shifted toward either side to be used for the purpose of positioning inspection, the accuracy of positioning the sensor 100 sometimes decreases due to the harmful effect of the molding bur 131. This causes a decline in the tilt accuracy of the sensor 100 being mounted or the orientation accuracy thereof at the time of characteristic measurement.

Figure 12:
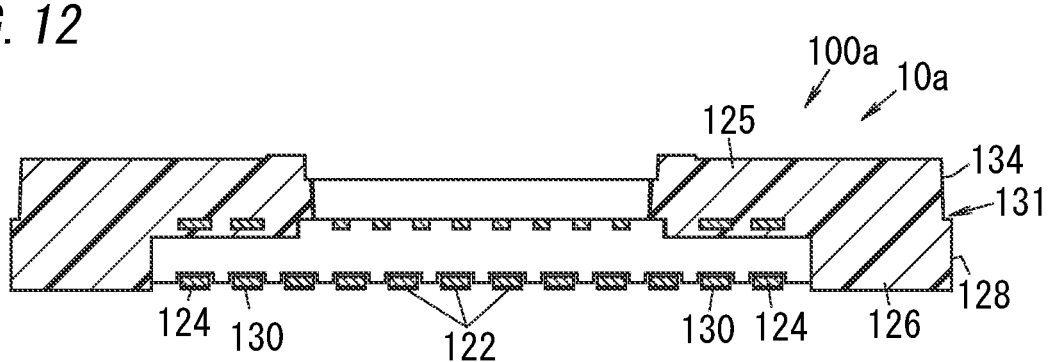
FIG. 12 is a cross-sectional view thereof taken along the plane A-A shown in FIG. 10A.

To overcome such a problem, in the mount board 10a, the weld line 132 is shifted from a positioning plane such that no molding bur 131 will be present on a reference surface 128 when the sensor 100a is positioned during the mounting process of the sensor 100a. In other words, the sensor 100a includes the sensor device 1 and the mount board 10a to mount the sensor device 1 thereon. On the mount board 10a, the molding bur 131 is present on a different surface 134 other than the reference surface 128 for positioning. Specifically, during the resin molding process of the mount board 10a, the reference surface 128 for positioning is shifted outward from the center of the mount board with respect to a part to be molded with the upper die 125 of the die assembly and a part to be molded with the lower die 126 of the die assembly. The molding bur 131 tends to be left in the vicinity of the weld line 132, thus allowing a region where the molding bur 131 tends to be left to be shifted from the reference surface 128 for positioning. FIG. 12 is a cross-sectional view taken along the plane A-A shown in FIG. 10. In FIG. 12, the region where the molding bur 131 tends to be left is shifted from the reference surface 128 for positioning. This reduces, when the sensor 100a is positioned with a positioning clamper, for example, while being mounted onto the board, the chances of the sensor 100a being affected by the molding bur 131.

(First Variation of Fourth Embodiment)

Next, variations will be enumerated one after another. Optionally, the variations to be described below may be adopted as appropriate in combination with any of the embodiments described above.

In a mount board 10b according to a first variation, a position where a terminal is exposed out of the resin is shifted from the positioning surface to prevent the molding bur 131 from being left on a surface used for positioning the product, which is a major difference from the fourth embodiment described above. In other words, the terminal 127 of the mount board 10b is exposed out of the different surface 134.

In known sensors, the reference surface 128 for positioning and the region where the terminal 127 is exposed out of the resin and where the molding bur 131 is often left are present on the same plane. Therefore, the molding bur 131 often causes a decline in positioning accuracy when a robot, for example, grips the sensor 100b mechanically.

Thus, according to the first variation, the reference surface 128 for positioning during the resin molding process and the region where the terminal 127 is exposed out of the resin are shifted from each other, thereby reducing the chances of causing a decline in positioning accuracy even when the molding bur 131 is present. Specifically, on the mount board 10b, the region where the terminal 127 is exposed out of the resin is shifted inward (i.e., toward the center of the mount board 10b) with respect to the reference surface 128 for positioning in the die assembly for use in resin molding as shown in FIG. 11B. The region where the terminal 127 is exposed out of the resin is a region where the molding bur 131 is often left. However, even if the molding bur 131 is present in that region, the region is still away from the reference surface 128 for positioning, thus reducing the chances of the molding bur 131 being present on the reference surface 128 for positioning. This enables reducing, while the sensor 100b is being positioned to be mounted onto a printed wiring board, for example, the effect of the molding bur 131 and thereby decreasing the tilt, for example, of the sensor 100b during the mounting process.

(Second Variation of Fourth Embodiment)

On a mount board 10c according to a second variation, insert terminals for fixing terminals are provided at the four corners of the mount board 10c before the molding process and then removed after the molding process, which is a major difference from the third embodiment described above.

Figure 10B:
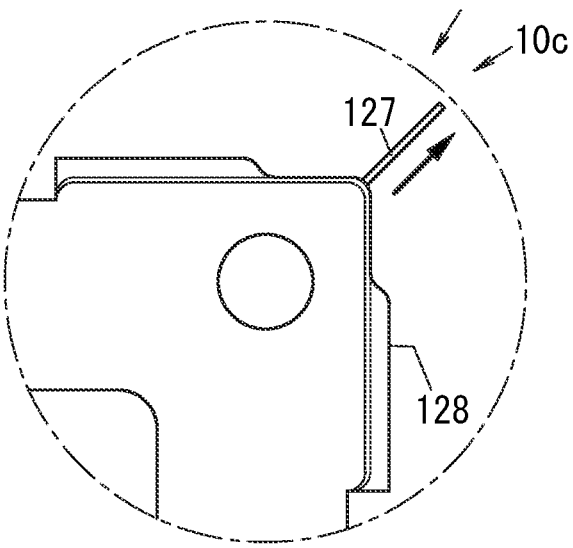
FIG. 10B is an enlarged view of a region B shown in FIG. 10A.

The four corners of the mount board are regions where the upper and lower dies of a die assembly are mated with each other, and therefore, the molding bur 131 tends to be left there. Furthermore, according to this variation, after the mount board 10c has been molded, the insert terminals 127 are removed, thus often leaving the molding bur 131 and/or dust or dirt involved with the removal. Thus, the mount board 10c according to this variation introduces the insert terminals 127 into the four corners during the molding process and shifts, on the die assembly, the reference surface 128 for positioning from the regions where the insert terminals 127 are exposed out of the resin as shown in FIG. 10B, thus reducing the harmful effect of the molding bur 131. This may reduce the tilt of the product when the product is held mechanically or positioned.

(Fifth Embodiment)

Figure 13A:
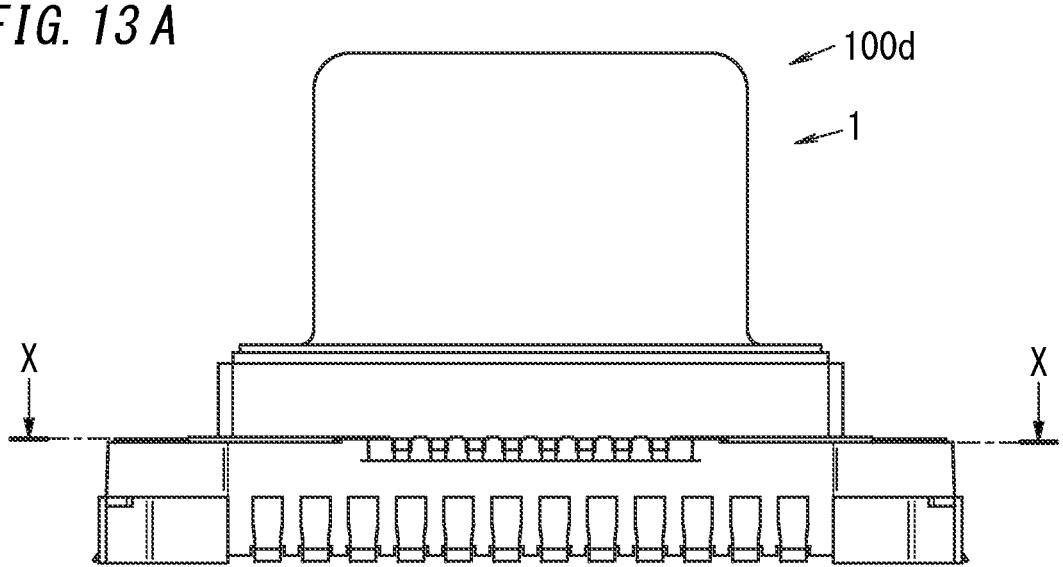
FIG. 13A is a side view of a sensor according to a fifth embodiment.

In a sensor 100d according to a fifth embodiment, the installation state of the sensor device 1 on the mount board 10d is different as shown in FIG. 13A from in the fourth embodiment described above. In this embodiment, to connect the sensor device 1 to the mount board 10d, projections 121 (to be described later) are provided, which is a major difference from the fourth embodiment. The sensor 100d according to this embodiment includes the sensor device 1, the mount board 10d, the projections 121, and an adhesive 133.

In this embodiment, the sensor device 1 and the mount board 10d are connected together with the adhesive 133 and solder. The adhesive 133 is originally in liquid state, and therefore, shrinks while curing. Likewise, solder also reflows, thus making the sensor device 1 tilted, not parallel to, the mount board 10d while the solder is being solidified. Specifically, when the sensor device 1 is misaligned with its axis, the other axis sensitivity of the sensor device 1 might decline.

Figure 13B:
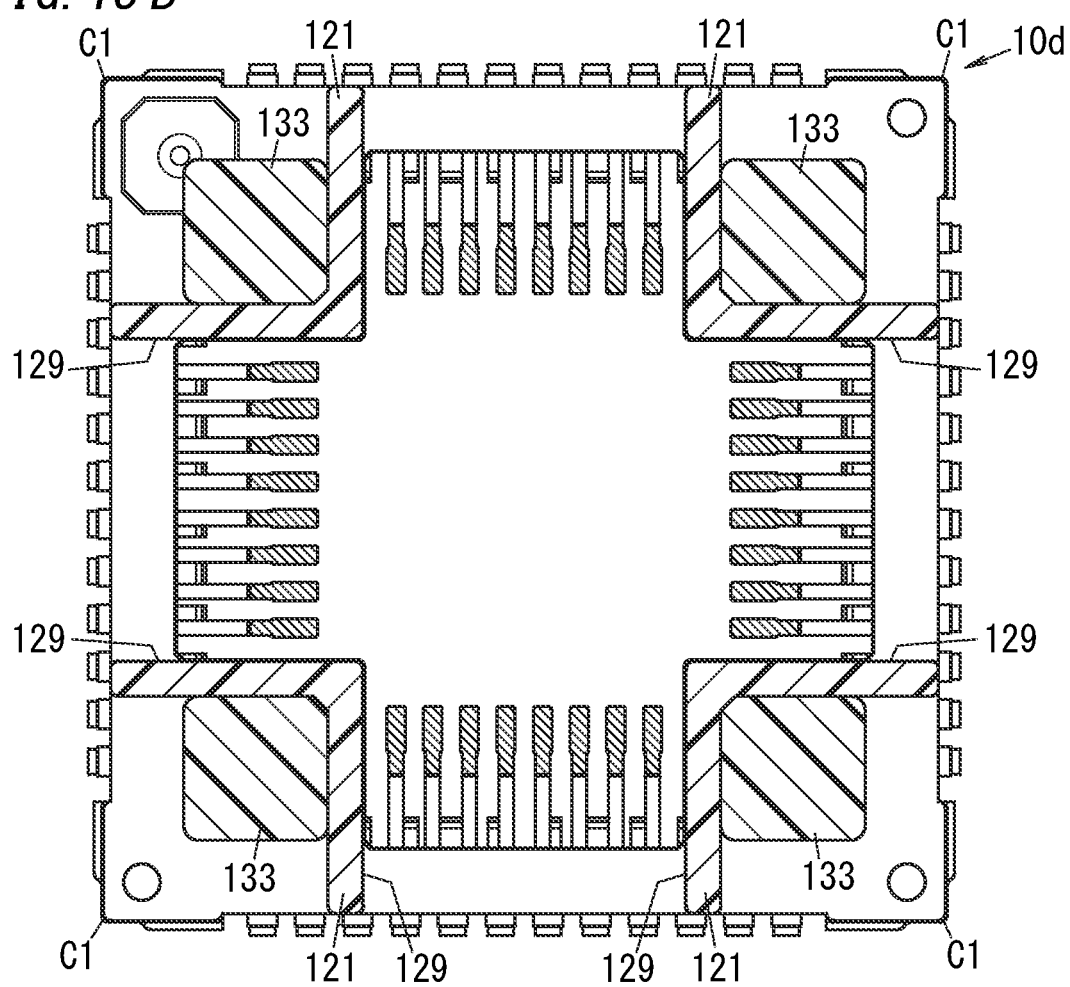
FIG. 13B is a cross-sectional view thereof taken along the plane X-X shown in FIG. 13A.

FIG. 13B is a cross-sectional view taken along the plane X-X shown in FIG. 13A. In this embodiment, the projections 121 are formed of a resin on the mount board 10d that has been molded with a resin, and bonded to the sensor device 1, thereby mounting the sensor device 1 parallel to one surface 101 of the mount board 10d. These at least three projections 121 are respectively provided for at least three corners C1 of the mount board 10d. Specifically, four L-shaped projections 121 are respectively formed at the four corners of the mount board 10d and the sensor device 1 is installed with a reference plane defined by the four projections 121. In other words, to connect the sensor device 1 and the mount board 10d together, the mount board 10d is provided with at least three projections 121 and the sensor device 1 is bonded to the at least three projections 121 and thereby installed onto the mount board 10d.

What fixes the sensor device 1 onto the mount board 10 may be solder alone or both solder and the adhesive 133, whichever is appropriate. In other words, at least one of solder or the adhesive 133 may be used. Using the four projections 121 of the mount board 10 as a reference plane may reduce the harmful effect of a material having a non-solid state such as solder and the adhesive 133. When the sensor device 1 and the mount board 10 are bonded together with both the solder and the adhesive 133 used, the solder and the adhesive 133 have the same height.

(First Variation of Fifth Embodiment)

Next, variations will be enumerated one after another. Optionally, the variations to be described below may be adopted as appropriate in combination with any of the embodiments described above.

In the fifth embodiment described above, the installation plane on which the sensor device 1 and the mount board 10 are installed is defined by four points to prevent stress from being applied asymmetrically. In this variation, the installation plane is defined by three points, which is a major difference from the fifth embodiment. Defining the installation plane by three points also causes, for example, the problem of symmetry. Thus, in that case, the installation plane is suitably defined by three points that are as symmetric to each other as possible.

(Second Variation of Fifth Embodiment)

In a second variation, a groove portion 129 is further provided along the peripheral edges, facing the center of the mount board 10, of each of the four projections 121, which is a major difference from the fifth embodiment. The groove portion 129 reduces the chances of the adhesive 133 flowing into a region where the sensor device 1 and the mount board 10 are soldered together. Providing the projections 121 and the groove portions 129 reduces the chances of the adhesive 133 flowing into the region where the sensor device 1 and the mount board 10 are soldered together.

(Sixth Embodiment)

Figure 14A:
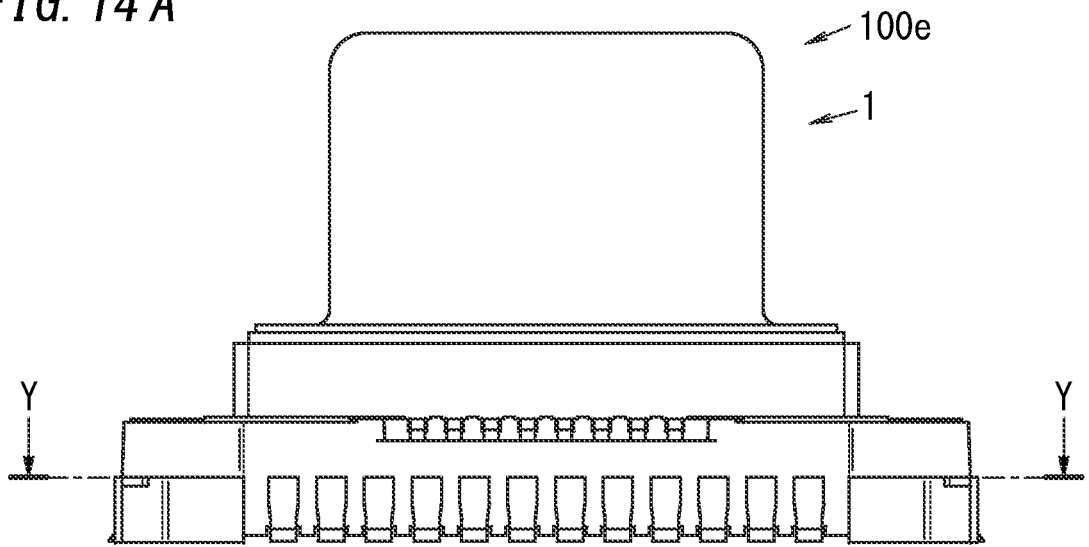
FIG. 14A is a side view of a sensor according to a sixth embodiment.
Figure 14B:
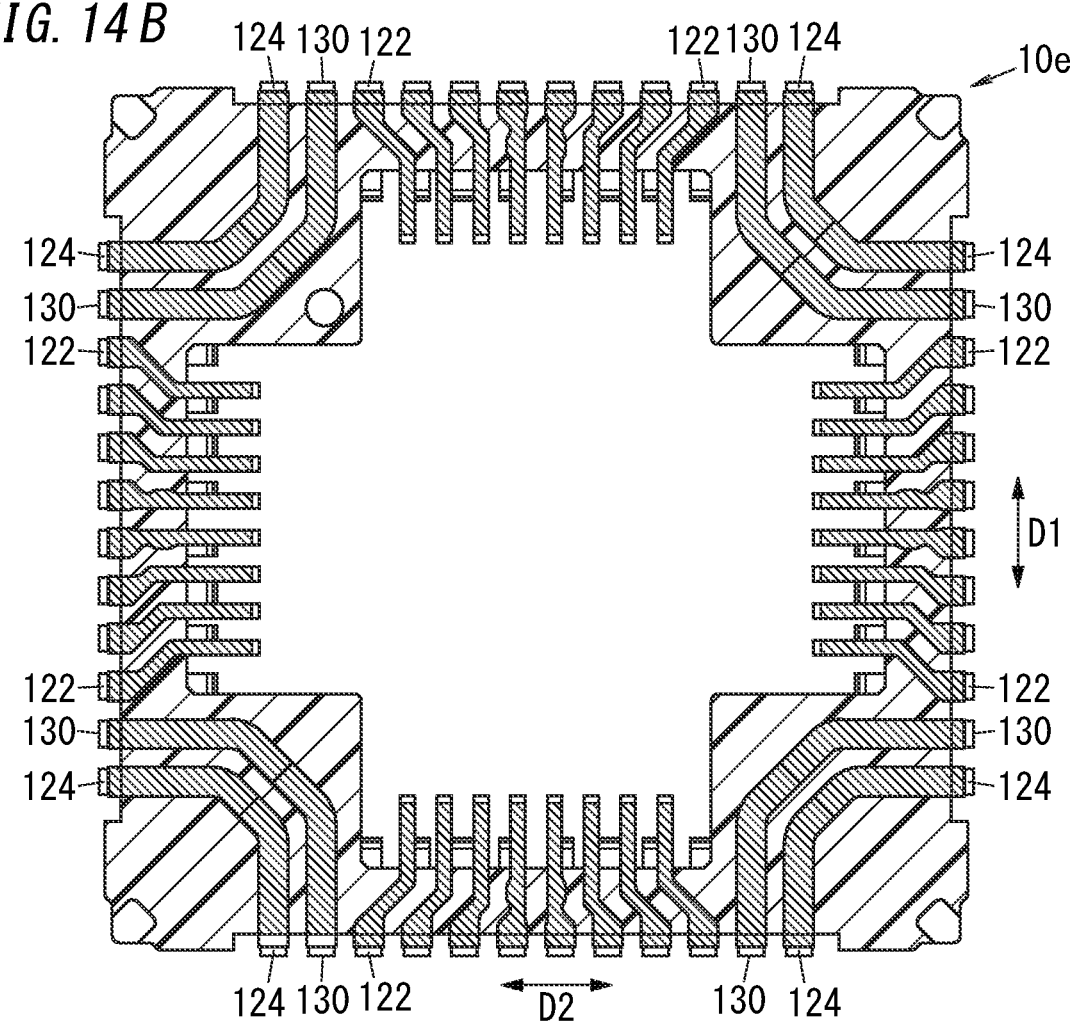
FIG. 14B is a cross-sectional view thereof taken along the plane Y-Y shown in FIG. 14A.

In a sensor 100e according to a sixth embodiment, the mount board 10 is provided with lead terminals as additional members as shown in FIG. 14A, which is a major difference from the fourth embodiment described above. The sensor 100e according to this embodiment includes the sensor device 1, a mount board 10e, and lead terminals 124, 130. FIG. 14B is a cross-sectional view taken along the plane Y-Y shown in FIG. 14A. For the mount board 10e having a generally square shape, each side of the generally square mount board 10e is provided with four lead terminals 124, 130 as outermost terminals (i.e., sixteen lead terminals in total). Specifically, two lead terminals 124 are provided for the outermost portions of each side of the mount board 10e and two more lead terminals 130 are provided for the second outermost portions of each side. That is to say, two lead terminals are arranged as additional members on each of both ends of each side of the mount board 10e. Each lead terminal 124 located at the outermost portion is electrically connected, with solder, to the lead terminal 124 located at the outermost portion of an associated one of the two adjacent sides. Each lead terminal 130 located at the second outermost portion is electrically connected, with solder, to the lead terminal 130 located at the second outermost portion of an associated one of the two adjacent sides. These lead terminals provided as additional members are dummy terminals. Thus, the lead terminals 124, 130 will be hereinafter referred to as "dummy terminals 124, 130."

In the mount board 10e having the generally square shape, a direction aligned with one side thereof will be hereinafter referred to as a "first direction D1" and a direction aligned with an adjacent side thereof will be hereinafter referred to as a "second direction D2," where the second direction D2 is perpendicular to the first direction D1. In this case, the mount board 10e is provided in the first direction D1 with one or more terminals 122 serving as first terminal(s) and the dummy terminals 124, 130 serving as first dummy terminals. In addition, the mount board 10e is also provided in the second direction D2 with one or more terminals 122 serving as second terminal(s) and the dummy terminals 124, 130 serving as second dummy terminals. The first dummy terminals are provided outside of the outermost one of the one or more first terminals 122. The second dummy terminals are provided outside of the outermost one of the one or more second terminals 122. The first dummy terminals and the second dummy terminals are connected together via the mount board 10e. For example, a dummy terminal 124 serving as the first dummy terminal and another dummy terminal 124 serving as the second dummy terminal are connected together via the mount board 10e. In addition, a dummy terminal 130 serving as the first dummy terminal and another dummy terminal 130 serving as the second dummy terminal are connected together via the mount board 10e.

Using the sensor 100e in a wide temperature range increases the chances of solder undergoing deterioration. Examples of the deterioration of solder include cracking of the solder and an increase in electrical resistance of the solder. The deterioration advances more rapidly on the outermost terminal than any other terminal. Thus, providing two dummy terminals outside of an outer real terminal 122 may reduce the chances of inner terminals undergoing such deterioration.

In addition, connecting the interconnected dummy terminals to the supporting member 4 (implemented as an ASIC in this embodiment) and monitoring the resistance value thereof allows the degree of deterioration of the solder to be inspected. In other words, the first dummy terminals 124 and the second dummy terminals 124 are connected to a processor circuit 43 via the mount board 10e. Specifically, connecting the ASIC to the sensor device 1 and forming a loop circuit via the solder that connects the lead terminals 124 and the mount board 10e to the substrate 3, and the solder and the lead terminals 124 that connect the mount board 10e to the substrate 3 allows the degree of deterioration of the solder to be inspected.

(Variations of Sixth Embodiment)

Next, variations will be enumerated one after another. Optionally, the variations to be described below may be adopted as appropriate in combination with any of the embodiments described above.

In the sixth embodiment described above, two dummy terminals are provided for each of both ends of each side of the mount board 10e (i.e., four dummy terminals are provided in total for each side). However, this configuration is only an example and should not be construed as limiting. Optionally, another terminal may be further provided between the outermost portion and a real terminal. This may further reduce the concentration of stress onto the real terminal.

(Recapitulation)

As can be seen from the foregoing description, a sensor device (1, 1A-1D) according to a first aspect includes a sensor element (2), a supporting member (4), a substrate (3), and a bonding wire (6, 6A, 6D). The supporting member (4) is electrically connected to the sensor element (2). The substrate (3) is electrically connected to the supporting member (4). The bonding wire (6, 6A, 6D) forms at least part of a connection path (60) that electrically connects the sensor element (2) and the supporting member (4) together. The substrate (3) and an installation member on which the sensor element (2) is installed intersect with each other. The sensor element (2) and the supporting member (4) are separated from each other.

According to this aspect, at least part of a connection path (60) that electrically connects the sensor element (2) and the substrate (3) to each other is configured as a bonding wire (6, 6A, 6D) to connect the substrate and the installation member that intersect with each other. This enables reducing, compared to a situation where the supporting member (4) is provided to intersect with the substrate (3), the height of the sensor device (1, 1A-1D). Reducing its height shortens the length of the bonding wire (6, 6A, 6D), thus reducing the chances of the bonding wire being deformed and also alleviating the effect caused by impact. In addition, this also achieves the advantage of contributing to increasing the degree of freedom in shape or dimensions.

In a sensor device (1, 1A-1D) according to a second aspect, which may be implemented in conjunction with the first aspect, the installation member, on which the sensor element (2) is installed, and the substrate (3) intersect with each other at right angles.

This aspect facilitates adjusting the sensor device (1, 1A-1D).

In a sensor device (1, 1A-1D) according to a third aspect, which may be implemented in conjunction with the first or second aspect, the bonding wire (6, 6A) connects the supporting member (4) and the sensor element (2) that intersect with each other.

According to this aspect, connecting, with the bonding wire (6, 6A, 6D), the supporting member (4) and the sensor element (2) that intersect with each other enables shortening the length of the bonding wire (6, 6A, 6D).

A sensor device (1, 1A-1D) according to a fourth aspect, which may be implemented in conjunction with any one of the first to third aspects, further includes a coupling member (5) including the installation member and provided for the substrate (3). The sensor element (2) is installed indirectly over the substrate (3) via the coupling member (5).

This aspect allows the coupling member (5) to reduce the stress applied to the sensor element.

In a sensor device (1, 1A-1D) according to a fifth aspect, which may be implemented in conjunction with the fourth aspect, the coupling member (5) includes: a first member stacked on the substrate (3); and a second member serving as the installation member. The first member and the second member intersect with each other.

This aspect enables providing a vertical sensor device (1, 1A-1D) in which the substrate (3) and the sensor element (2) intersect with each other. In addition, this aspect also achieves the advantage of contributing to increasing the degree of freedom in shape or dimensions.

In a sensor device (1, 1A-1D) according to a sixth aspect, which may be implemented in conjunction with the fourth or fifth aspect, the sensor element (2) and the supporting member (4) are provided on the same surface of the coupling member (5).

This aspect enables shortening the length of the bonding wire (6) that connects the sensor element (2) and the supporting member (4) to each other. Shortening the length of the bonding wire (6, 6A, 6D) reduces the chances of producing resonances or causing deformation.

In a sensor device (1, 1A-1D) according to a seventh aspect, which may be implemented in conjunction with any one of the first to sixth aspects, the substrate (3) has an installation surface (31) over which a vertical member (50) including the sensor element (2) is installed. The vertical member (50) is fixed to the installation surface (31) such that a normal (L1) to an electrode surface (24) of the sensor element (2) is aligned with a supporting surface (41) of the supporting member (4).

This aspect allows the sensor element (2) to be installed to stand upright with respect to the supporting member (4).

A sensor (100, 100a-100e) according to an eighth aspect includes the sensor device (1, 1A-1D) according to any one of the first to seventh aspects and a mount board (10, 10a-10e) provided to install the sensor device (1, 1A-1D) thereon. The mount board (10, 10a-10e) has molding bur (131) on a different surface (134) other than a reference surface (128) for positioning.

This aspect may reduce, while the sensor (100, 100a-100e) is mounted, the chances of the sensor (100, 100a-100e) being shifted or the sensor axis being misaligned due to the presence of the molding bur (131).

In a sensor (100, 100a-100e) according to a ninth aspect, which may be implemented in conjunction with the eighth aspect, a terminal (127) of the mount board (10, 10*a*-10*e*) is exposed out of the different surface (134).

According to this aspect, the molding bur (131) left by the terminal (127) is present on a different surface (134) other than the reference surface (128) for positioning, thus reducing the effect of the molding bur (131) on positioning of the sensor (100, 100*a*-100*e*).

In a sensor (100, 100*a*-100*e*) according to a tenth aspect, which may be implemented in conjunction with the eighth or ninth aspect, at least three projections (121) are provided for the mount board (10, 10*a*-10*e*). The sensor device (1, 1A-1D) is bonded to the at least three projections (121) and thereby installed on the mount board.

This aspect allows the sensor device (1, 1A-1D) and the mount board (10, 10*a*-10*e*) to be bonded to each other without being affected by solder or an adhesive, thus stabilizing their connection.

In a sensor (100, 100*a*-100*e*) according to an eleventh aspect, which may be implemented in conjunction with the tenth aspect, the at least three projections (121) are respectively provided for at least three corners (C1) of the mount board (10, 10*a*-10*e*).

This aspect allows projections (121) serving as reference members for positioning to be selected from the projections provided at symmetric positions. In addition, the projections (121) also reduce the outflow of the adhesive.

In a sensor (100, 100*a*-100*e*) according to a twelfth aspect, which may be implemented in conjunction with the tenth or eleventh aspect, each of the at least three projections (121) has a groove portion (129) provided along peripheral edges, facing a center of the mount board, of the projection (121).

According to this aspect, the adhesive is collected in the groove portion (129), thus reducing the outflow of the adhesive.

In a sensor (100, 100*a*-100*e*) according to a thirteenth aspect, which may be implemented in conjunction with any one of the eighth to twelfth aspects, the sensor device (1, 1A-1D) and the mount board (10, 10*a*-10*e*) are fixed to each other with at least one of solder or an adhesive.

According to this aspect, using at least solder for the purpose of electrical connection and using at least one of solder or adhesive for other purposes allows the sensor device (1, 1A-1D) and the mount board (10, 10*a*-10*e*) to be fixed to each other advantageously.

In a sensor (100, 100*a*-100*e*) according to a fourteenth aspect, which may be implemented in conjunction with any one of the eighth to thirteenth aspects, on the mount board (10, 10*a*-10*e*), one or more first terminals (122) and a first dummy terminal (such as dummy terminals 124, 130) are provided in a first direction (D1) and one or more second terminals (122) and a second dummy terminal (such as dummy terminals 124, 130) are provided in a second direction (D2) perpendicular to the first direction (D1). The first dummy terminal is provided outside of an outermost first terminal (122) out of the one or more first terminals (122). The second dummy terminal is provided outside of an outermost second terminal (122) out of the one or more second terminals (122). The first dummy terminal and the second dummy terminal are connected to each other via the mount board (10, 10*a*-10*e*).

According to this aspect, the dummy terminals (124, 130) may reduce deterioration of solder from an outermost portion due to the temperature, stress, or any other factor of the environment surrounding the sensor (100, 100*a*-100*e*).

In a sensor (100, 100*a*-100*e*) according to a fifteenth aspect, which may be implemented in conjunction with the fourteenth aspect, the first dummy terminal and the second dummy terminal are connected to a processor circuit (43) via the mount board (10, 10*a*-10*e*).

According to this aspect, connecting the first dummy terminal and the second dummy terminal to the processor circuit (43) enables predicting or detecting a failure to be caused by deterioration of the solder.

REFERENCE SIGNS LIST 1, 1A, 1B, 1C, 1D Sensor Device
2 Sensor Element
3 Substrate
4 Supporting Member
5 Coupling Member
6 Bonding Wire
50 Vertical Member
31 Installation Surface
24 Electrode Surface
L1 Normal to Electrode Surface
41 Supporting Surface
10, 10*a*, 10*b*, 10*c*, 10*d*, 10*e* Mount Board
100, 100*a*, 100*b*, 100*c*, 100*d*, 100*e* Sensor
121 Projection
122 Terminal (First Terminal, Second Terminal)
127 Terminal
128 Reference Surface
134 Different Surface
129 Groove Portion
124, 130 Lead Terminal (Dummy Terminal, First Dummy Terminal, Second Dummy Terminal)
43 Processor Circuit
C1 Corner
D1 First Direction
D2 Second Direction

The invention claimed is:
1. A sensor device comprising:
a sensor element;
a supporting member electrically connected to the sensor element;
a substrate electrically connected to the supporting member and having an installation surface;
a bonding wire forming at least part of a connection path that electrically connects the sensor element and the supporting member together; and
a coupling member formed in an L-shape and disposed on the installation surface of the substrate, wherein:
the coupling member includes:
a first member fixed to the installation surface of the substrate, and
a second member serving as an installation member on which the sensor element is disposed,
the second member protrudes from the first member in a direction normal to the installation surface of the substrate, and
the sensor element and the supporting member are separated from each other.
2. The sensor device of claim 1, wherein the bonding wire connects the supporting member and the sensor element.
3. The sensor device of claim 1, wherein;
the sensor element has an electrode surface connected to the bonding wire,
the supporting member has a supporting surface connected to the boding wire, and
the coupling member is fixed to the installation surface of the substrate such that a normal to the electrode surface of the sensor element is along with the supporting surface of the supporting member.

4. A sensor comprising:
the sensor device of claim 1; and
a mount board provided to install the sensor device thereon, wherein:
a side surface of the mount board includes:
a reference surface; and
a different surface located inside the references surface,
a molding bur is disposed on the different surface.

5. The sensor of claim 4, wherein a terminal of the mount board is exposed out of the different surface.

6. The sensor of claim 4, further comprising at least three projections projecting from the mount board,
wherein the sensor device is disposed on the mount board by being bonded to the at least three projections.

7. The sensor of claim 6, wherein the at least three projections respectively project from at least three corners of the mount board.

8. The sensor device of claim 6, wherein each of the at least three projections has a groove portion provided along peripheral edges, facing a center of the mount board, of the projection.

9. The sensor of claim 4, wherein the sensor device and the mount board are fixed to each other with at least one of solder or an adhesive.

10. A sensor comprising:
a sensor device; and
a mount board on which the sensor device is disposed, wherein:
the sensor device comprises:
a sensor element;
a supporting member electrically connected to the sensor element;
a substrate electrically connected to the supporting member and having an installation surface;
a bonding wire forming at least part of a connection path that electrically connects the sensor element and the supporting member together; and
a coupling member formed in an L-shape and disposed on the installation surface of the substrate,
the coupling member includes:
a first member fixed to the installation surface of the substrate, and
a second member serving as an installation member on which the sensor element is disposed,
the second member protrudes from the first member in a direction normal to the installation surface,
the sensor element and the supporting member are separated from each other,
on the mount board, one or more first terminals and a first dummy terminal are provided in a first direction and one or more second terminals and a second dummy terminal are provided in a second direction perpendicular to the first direction,
the first dummy terminal is provided outside of an outermost first terminal out of the one or more first terminals,
the second dummy terminal is provided outside of an outermost second terminal out of the one or more second terminals, the outermost second terminal being located closer to one end in the second direction than any other second terminal out of the one or more second terminals, and
the first dummy terminal and the second dummy terminal are connected to each other via the mount board.

11. The sensor of claim 10, wherein the first dummy terminal and the second dummy terminal are connected to a processor circuit via the mount board.

12. A sensor device comprising:
a sensor element;
a supporting member electrically connected to the sensor element;
a substrate electrically connected to the supporting member and having an installation surface;
a bonding wire forming at least part of a connection path that electrically connects the sensor element and the supporting member together; and
a coupling member having a flat plate shape, wherein:
the coupling member is disposed so as to stand upright on the installation surface of the substrate, and
the sensor element and the supporting member are provided on the same surface of the coupling member.

* * * * *